(12) United States Patent
Kanegae

(10) Patent No.: US 8,482,010 B2
(45) Date of Patent: *Jul. 9, 2013

(54) EL DISPLAY PANEL, EL DISPLAY APPARATUS, AND METHOD OF MANUFACTURING EL DISPLAY PANEL

(75) Inventor: Arinobu Kanegae, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/281,841

(22) Filed: Oct. 26, 2011

(65) Prior Publication Data

US 2012/0074423 A1  Mar. 29, 2012

Related U.S. Application Data

(63) Continuation of application No. PCT/JP2010/005850, filed on Sep. 29, 2010.

(51) Int. Cl.
*H01L 27/14* (2006.01)
*G09G 3/30* (2006.01)

(52) U.S. Cl.
USPC .......... 257/72; 257/40; 257/59; 257/E31.095; 438/99; 438/149; 345/76; 345/92

(58) Field of Classification Search
USPC ............ 345/76, 92; 257/40, 59, 72, E31.095; 438/99, 149
See application file for complete search history.

(56) References Cited

U.S. PATENT DOCUMENTS

| 5,529,951 | A | 6/1996 | Noguchi et al. |
|---|---|---|---|
| 5,869,803 | A | 2/1999 | Noguchi et al. |
| 6,071,765 | A | 6/2000 | Noguchi et al. |
| 7,456,811 | B2 | 11/2008 | Kwak |
| 7,768,485 | B2 | 8/2010 | Uchino et al. |
| 8,274,207 | B2 * | 9/2012 | Kanegae ..................... 313/498 |
| 2005/0179374 | A1 | 8/2005 | Kwak |

(Continued)

FOREIGN PATENT DOCUMENTS

| EP | 0 655 774 | 5/1995 |
|---|---|---|
| EP | 1 179 381 | 2/2002 |

(Continued)

OTHER PUBLICATIONS

U.S. Appl. No. 13/281,691 to Arinobu Kanegae, filed Oct. 26, 2011.

(Continued)

*Primary Examiner* — Jose R Diaz
(74) *Attorney, Agent, or Firm* — Greenblum & Bernstein, P.L.C.

(57) ABSTRACT

An EL display panel includes an organic EL device and a thin film semiconductor unit. The organic EL device includes a lower electrode, an organic light-emitting layer, and an upper electrode. The thin film semiconductor unit includes a first gate electrode, a gate insulating film, a first source electrode, a second drain electrode formed in a same layer as the first source electrode, a first power supply line formed in a same layer as the second drain electrode, and a first interlayer insulating film formed on the first source electrode and the second drain electrode. A gate line connected to the first gate electrode, a second power supply line formed in a same layer as the gate line and connected to the first power supply line, and an auxiliary line formed in a same layer as the second power supply line and connected to the upper electrode are included.

20 Claims, 28 Drawing Sheets

U.S. PATENT DOCUMENTS

2007/0268210 A1 11/2007 Uchino et al.
2008/0272992 A1 11/2008 Kwak
2010/0188384 A1 7/2010 Uchino et al.

FOREIGN PATENT DOCUMENTS

| | | |
|---|---|---|
| EP | 1 587 154 | 10/2005 |
| EP | 1 860 637 | 11/2007 |
| EP | 2 341 495 | 7/2011 |
| JP | 7-235490 | 9/1995 |
| JP | 2000-221907 | 8/2000 |
| JP | 2000-223279 | 8/2000 |
| JP | 2003-108033 | 4/2003 |
| JP | 2003-108068 | 4/2003 |
| JP | 2005-227788 | 8/2005 |
| JP | 2006-011059 | 1/2006 |
| JP | 2006-184384 | 7/2006 |
| JP | 2006-343504 | 12/2006 |
| JP | 2007-047808 | 2/2007 |
| JP | 2007-310311 | 11/2007 |
| JP | 2010-003880 | 1/2010 |
| JP | 2010-085866 | 4/2010 |
| JP | 2010-212328 | 9/2010 |

OTHER PUBLICATIONS

International Search Report in PCT/JP2010/005850, dated Nov. 2, 2011.

* cited by examiner

400

EL DISPLAY PANEL, EL DISPLAY APPARATUS, AND METHOD OF MANUFACTURING EL DISPLAY PANEL

CROSS REFERENCE TO RELATED APPLICATION

This is a continuation application of PCT application No. PCT/JP2010/005850 filed on Sep. 29, 2010, designating the United States of America.

BACKGROUND OF THE INVENTION (1) Field of the Invention

The present invention relates to EL display panels, EL display apparatuses, and methods of manufacturing EL display panels, and particularly relates to an EL display panel and an EL display apparatus used for an active-matrix display apparatus, and a method of manufacturing an EL display panel used for an active-matrix display apparatus.

(2) Description of the Related Art

Thin film transistors (TFT) are used as a switching device for selecting pixel or a driving device for display device in active-matrix drive display apparatuses such as liquid crystal display apparatuses and organic EL display apparatuses.

TFTs are used for active-matrix substrate of display apparatuses, and active research and development has been done for improving the capability. In particular, along with the increase in the size and increased definition of display apparatus, there is a demand for high driving capability TFT. In this context, semiconductor thin films (polysilicon and microcrystalline silicon) crystallized for channel layers (active layers) have been attracting attention.

As a crystallizing process of a semiconductor thin film, instead of the conventional high temperature process technology in which a treatment temperature of 1000 degrees Celsius or higher is used, a low temperature process utilizing a treatment temperature of 600 degrees Celsius or lower has developed. In the low temperature process, it is not necessary to use expensive substrate such as highly heat resistant quartz, which reduces manufacturing cost.

Laser annealing which uses laser beam for heating has attracted attention as a type of low temperature process. Laser annealing includes locally heating and melting, by irradiating laser beam, non-single crystal semiconductor thin film such as amorphous silicon laminated on an insulating substrate with low heat resistance such as glass, and crystallizing the semiconductor thin film during the cooling process. Mobility of carriers in the crystallized semiconductor thin film increases, improving capability of the thin film transistor (for example, see Patent Literature 1: Japanese Unexamined Patent Application Publication No. H07-235490).

Majority of thin film transistors have a bottom-gate structure in which gate electrodes are arranged in a level lower than the channel layer. The following describes a conventional bottom-gate thin film transistor with reference to FIGS. 23, 24A to 24C, and 25. FIG. 23 is a planar view of the conventional thin film semiconductor device corresponding to one pixel of the display apparatus. FIG. 24A is a cross-sectional view of the conventional thin film semiconductor device for a display apparatus along the line X1-X1' in FIG. 23. FIG. 24B is a cross-sectional view of the conventional thin film semiconductor device for display apparatus along the line X2-X2' in FIG. 23. FIG. 24C is a cross-sectional view of the conventional thin film semiconductor device for display apparatus along the line Y-Y' in FIG. 23. FIG. 25 is a perspective view corresponding to FIG. 24A, illustrating major components of the conventional thin film semiconductor device for display apparatus from the cross section X1-X1' in FIG. 23.

As illustrated in FIGS. 23, 24A to 24C, and 25, the conventional thin film semiconductor device 9 for display apparatus includes a gate line 921 formed along the row direction of the pixel, a source line 922 formed along the column direction of the pixel, and a thin film transistor 910 arranged at a position in which the gate line 921 and the source line 922 cross each other.

As illustrated in FIG. 24A, the thin film transistor 910 is a bottom-gate thin film transistor, and is a multilayer structure including a gate electrode 910G, a gate insulating film 930, a semiconductor layer (channel layer) 911, and one pair of source electrode 910S and a drain electrode 910D sequentially formed on a substrate 900.

As illustrated in FIGS. 23 and 24A, the gate electrode 910G extends from the gate line 921, and formed in a first metal layer ML1' in which the gate line 921 is also formed. The gate insulating film 930 is formed on the substrate 900 to cover the gate line 921 and the gate electrode 910G. The semiconductor layer 911 is formed on the gate insulating film 930 in an island shape overlapping the gate electrode 910G. One pair of the source electrode 910S and the drain electrode 910D is formed overlapping part of the semiconductor layer 911 and arranged separately opposite to each other. The source electrode 910S and the drain electrode 910D are formed in a second metal layer ML2', in which the source line 922 is also formed. Note that, an interlayer insulating film 940 is laminated covering the thin film transistor 910, the gate line 921, and the source line 922.

Here, when forming the semiconductor layer 911 in the bottom-gate thin film transistor 910 by forming amorphous silicon on the gate electrode 910G and crystallizing the amorphous silicon by laser annealing, the heat of laser annealing radiates through the gate electrode 910G when melting the amorphous silicon. Accordingly, it is preferable that the gate electrode 910G is made of a material with small heat conductivity for suppressing the radiation of the heat at the time of laser annealing for crystallizing the semiconductor layer 911.

In the gate line 921, high line resistivity causes delay in signals or uneven display due to voltage drop. Particularly, increased driving frequency due to increased panel dimension makes the panel more likely to be affected by the line resistivity. Therefore, it is preferable that the gate line 921 is composed of the material with low resistivity (specific resistance).

As described above, the gate electrode 910G and the gate line 921 are formed in the same layer. Thus, they are usually made of the same material. Thus, when the gate electrode 910G is made of the material with small heat conductivity in consideration of crystallizing the semiconductor layer 911, the gate line 921 is also made of the material with small heat conductivity. Alternatively, when the gate line 921 is made of the material with small resistivity in consideration of the line resistance of the gate line 921, the gate electrode 910G is also made of the material with small resistivity.

However, most of metal with small heat conductivity has high resistivity. Thus, it is difficult to satisfy both the concern in crystallizing the semiconductor layer 911 and the concern in line resistance of the gate line 921 at the same time.

In order to address this problem, the thin film semiconductor device for display apparatus which solves these concerns has been proposed (see Patent Literature 2: Japanese Unexamined Patent Application Publication No. 2007-047808). Patent Literature 2 discloses a structure in which the gate line is divided into two portions for satisfying both the heat conductivity of the gate electrode and reduced resistance in the gate line.

More specifically, in the thin film semiconductor device for display apparatus according to Patent Literature 2, the gate line includes an integral portion integrally formed with the gate electrode and a separate portion connected to the integral portion through a contact hole. In addition, the integrated portion of the gate line three-dimensionally crosses the source line interposing the gate insulating film in between. The integrated portion of the gate electrode and the gate line are made of material with lower heat conductivity than the separate portion of the gate line, while the separate portion of the gate line is made of material with lower resistivity than the gate electrode.

SUMMARY OF THE INVENTION

However, in the thin film semiconductor device for display apparatus disclosed in Patent Literature 2, the integrated portion of the gate electrode and the gate line is still made of the same material. Accordingly, in terms of the crystallization of the semiconductor layer, forming the gate electrode with the material having small heat conductivity increases the resistivity of the material composing the integrated portion of the gate line, increasing the resistance of the integrated portion of the gate line. As a result, there is a problem that the line resistance of the entire gate line including the integrated portion is not sufficiently reduced.

Furthermore, the integrated portion and the separate portion of the gate line are connected by two contact holes for each pixel. This causes an IR drop (voltage drop due to a product of the current I on the line and the resistance R) at the connecting portion of the integrated portion and the separate portion. In addition, the gate line for one line is alternately connected to the integrated portion and the separate portion. Thus, there is a problem that even one bad connection in the connected portion of the integrated portion and the separate portion results in disconnection of all of the pixels in one line along the gate line.

Furthermore, the gate line and the power supply line connected to the thin film transistor three dimensionally crosses each other interposing a gate insulating film with a thickness of approximately 200 nm. Thus, when reducing thickness of the gate insulating film for improving the capability of the thin film transistor, the interval between the gate line and the power supply line becomes even narrower, increasing parasitic capacitance between the lines.

Furthermore, when the display apparatus utilizing the thin film semiconductor device for display apparatus is used is an EL display apparatus, an auxiliary line electrically connected to an upper electrode (cathode) is formed for each pixel in the EL layer in which an organic EL device is formed. As a result, there is a problem that the auxiliary line reduces the aperture ratio of the pixels.

The present invention has been conceived in view of these problems, and it is an object of the present invention to provide an EL display panel, an EL display apparatus, and a method of manufacturing an EL display panel which allows the gate electrode and the gate line to be composed of material suitable for each component, and reduces parasitic capacitance between the gate line and the power supply line.

In order to solve the problems described above, an embodiment of the EL display panel according to the present invention is an Electro Luminescence (EL) display panel including: an EL unit; and a thin film semiconductor unit which controls luminescence at the EL unit, in which the EL unit includes: an anode electrode; a cathode electrode; and a light-emitting layer interposed between the anode electrode and the cathode electrode, the thin film semiconductor unit includes: a substrate; a gate electrode formed above the substrate; a gate insulating film formed above the substrate to cover the gate electrode; a semiconductor layer formed on the gate insulating film and above the gate electrode; a first electrode formed above the semiconductor layer; a second electrode formed in a same layer as the first electrode; a first power supply line electrically connected to the second electrode and formed in a same layer as the second electrode; a first interlayer insulating film formed above the gate insulating film to cover the first electrode and the second electrode; a gate line formed above the first interlayer insulating film to cross the first power supply line, the first interlayer insulating film being in a layer different from a layer in which the gate electrode is formed; a second power supply line formed in a same layer as the gate line and side-by-side with the gate line; and an auxiliary line formed in a same layer as the second power supply line and side-by-side with the second power supply line, and the gate electrode and the gate line are electrically connected via a first conductive portion passing through the gate insulating film and the first interlayer insulating film, the first power supply line and the second power supply line are electrically connected via a second conductive portion passing through the first interlayer insulating film, and the auxiliary line is electrically connected to the cathode electrode.

According to the EL display panel of the present invention, the gate line and the gate electrode are formed in different layers. Thus, it is possible to select different materials suitable for the gate line and the gate electrode.

Furthermore, the gate line is formed above the first interlayer insulating film and the first power supply line is formed below the first interlayer insulating film. Thus, it is possible to secure a distance between the gate line and the first power supply line. With this, it is possible to reduce parasitic capacitance between the gate line and the first power supply line.

Furthermore, the second electrode is electrically connected, and the first power supply line is electrically connected to the second power supply line, and the first power supply line and the second power supply line are arranged to cross each other. With this, the second electrode can receive power supply from two directions; from the first power supply line and the second power supply line. With respect to the IR drop generated along the increase in screen size of the display apparatus in the central region of the display area, it is possible to reduce the IR drop amount.

Furthermore, since the second power supply line and the auxiliary line are formed in the same layer as the gate line and side-by-side with the gate line. Thus, it is possible to reduce the unevenness caused by the gate line on the first interlayer insulating film by the second power supply line and the auxiliary line. With this, it is possible to improve the flatness of the layer under the EL unit.

In addition, it is possible to supply power to the second electrode by two power supply lines, the first power supply line and the second power supply line. Thus, it is possible to suppress disconnected pixels, thereby suppressing the unevenness in the display of the display apparatus.

Furthermore, since the auxiliary line is formed in the same layer as the gate line, it is not necessary to form a separate auxiliary in the EL unit. This increases the aperture ratio of the pixels, thereby increasing the life of the display panel.

FURTHER INFORMATION ABOUT TECHNICAL BACKGROUND TO THIS APPLICATION

The disclosure of PCT application No. PCT/JP2010/005850 filed on Sep. 29, 2010, including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

Figure 1:
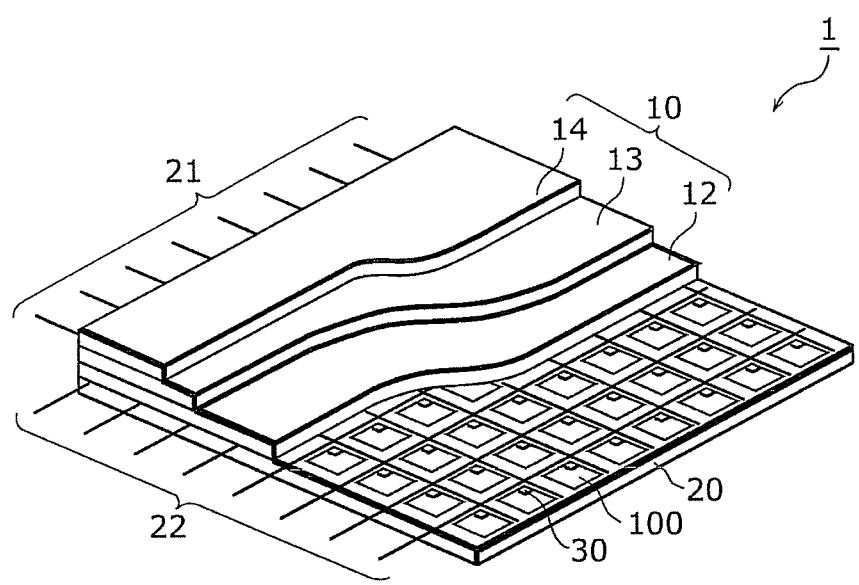
FIG. 1 is a partial cutout perspective view of an organic EL display panel according to the first embodiment of the present invention.

An aspect of the EL display panel according to the present invention is an Electro Luminescence (EL) display panel including: an EL unit; and a thin film semiconductor unit which controls luminescence at the EL unit, in which the EL unit includes: an anode electrode; a cathode electrode; and a light-emitting layer interposed between the anode electrode and the cathode electrode, the thin film semiconductor unit includes: a substrate; a gate electrode formed above the substrate; a gate insulating film formed above the substrate to cover the gate electrode; a semiconductor layer formed on the gate insulating film and above the gate electrode; a first electrode formed above the semiconductor layer; a second electrode formed in a same layer as the first electrode; a first power supply line electrically connected to the second electrode and formed in a same layer as the second electrode; a first interlayer insulating film formed above the gate insulating film to cover the first electrode and the second electrode; a gate line formed above the first interlayer insulating film to cross the first power supply line, the first interlayer insulating film being in a layer different from a layer in which the gate electrode is formed; a second power supply line formed in a same layer as the gate line and side-by-side with the gate line; and an auxiliary line formed in a same layer as the second power supply line and side-by-side with the second power supply line, and the gate electrode and the gate line are electrically connected via a first conductive portion passing through the gate insulating film and the first interlayer insulating film, the first power supply line and the second power supply line are electrically connected via a second conductive portion passing through the first interlayer insulating film, and the auxiliary line is electrically connected to the cathode electrode.

According to this aspect, the gate line is arranged on the first interlayer insulating film which is in a layer different from the layer in which the gate electrode is formed. Thus, it is possible to select different materials suitable for the gate line and the gate electrode.

Furthermore, according to this aspect, the gate line is formed on the first interlayer insulating film and the first power supply line is formed below the first interlayer insulating film. Thus, it is possible to secure a distance between the gate line and the first power supply line by increasing the thickness of the first interlayer insulating film. With this, it is possible to reduce parasitic capacitance between the gate line and the first power supply line.

Furthermore, according to this aspect, the second electrode is electrically connected to the first power supply line, and the first power supply line is electrically connected to the second power supply line, and the first power supply line and the second power supply line are arranged to cross each other. With this, with respect to the IR drop generated along the increase in screen size of the display apparatus in the central region of the display area, it is possible to reduce the IR drop amount.

Furthermore, since the second power supply line and the auxiliary line are formed in the same layer as the gate line and side-by-side with the gate line. Thus, it is possible to reduce the unevenness caused by the gate line on the first interlayer insulating film by the second power supply line and the auxiliary line. With this, it is possible to improve the flatness of the thin film semiconductor unit.

In addition, it is possible to supply power to the second electrode by two power supply lines, the first power supply line and the second power supply line. Thus, it is possible to suppress disconnected pixels, thereby suppressing the unevenness in the display of the display apparatus.

Furthermore, according to this aspect, the auxiliary line is arranged in the thin film semiconductor unit instead of the EL unit, and side-by-side with the gate line and the second power supply line. In other words, the auxiliary line is arranged in a layer other than the EL unit, which is already used for arranging the gate line and the second power supply line. With this, it is possible to increase the flexibility in designing the EL unit without narrowing the thin film semiconductor unit. Furthermore, it is not necessary for the auxiliary line to be arranged in the EL unit. Thus, the aperture ratio of each pixel is increased, thereby increasing the amount of light emitted from the EL display panel. In addition, the increased amount of emitted light allows the EL display panel to achieve a brightness equivalent to the conventional EL display panel even if the intensity of emitted light per unit area is decreased. Consequently, it is possible to implement a long-life EL display panel.

Furthermore, in an aspect of the EL display panel according to the present invention, it is preferable that the second power supply line and the auxiliary line are formed at a level identical to or within a predetermined approximate value from the gate line, the second power supply line and the auxiliary line are arranged between two adjacent the gate lines, and a width of a combination of the second power supply line and the auxiliary line corresponds to a width of an interval between the two adjacent gate lines.

According to this aspect, it is possible to further increase the flatness of the EL display panel. More specifically, when the gate line is formed on the first interlayer insulating film, the gate lines protrudes from a region in which the gate line is not formed as much as the thickness of the gate line without any adjustment. In contrast, according to this embodiment, the width of the combination of the second power supply line and the auxiliary line corresponds to a width of an interval between the two adjacent gate lines. Therefore, the second power supply line and the auxiliary line can be used as structure for planarizing the second interlayer insulating film. Thus, it is possible to secure the flatness of the semiconductor thin film unit with a simple structure.

Furthermore, in an aspect of the EL display panel according to the present invention, it is preferable that a distance from the second power supply line or the auxiliary line to the two adjacent gate lines is 4 μm or greater.

According to this aspect, it is possible to arrange the second power supply line or the auxiliary line and the gate line without affecting each other. Furthermore, it is possible to increase the flatness of the thin film semiconductor unit.

Furthermore, in an aspect of the EL display panel according to the present invention, it is preferable that the second power supply line and the auxiliary line are formed at a level identical to or within a predetermined approximate value from the gate line, and the second power supply line and the auxiliary line are arranged near the gate line to fill an interval between two adjacent the gate lines.

According to this embodiment, it is possible to further increase the flatness of the thin film semiconductor unit.

Furthermore, in an aspect of the EL display panel according to the present invention, it is preferable that the second power supply line and the auxiliary line are formed at a level identical to or within a predetermined approximate value from the gate line, and the second power supply line and the auxiliary line are wider than a width of the first power supply line.

According to this embodiment, it is possible to further increase the flatness of the thin film semiconductor unit. Furthermore, it is possible to set resistance of the second power supply line to be smaller than the resistance of the first power supply line, thereby significantly reducing the IR drop.

Furthermore, in an aspect of the EL display panel according to the present invention, it is preferable that the second power supply line and the auxiliary line have a uniform thickness, and formed along a shape of a surface under the power supply line and the auxiliary line.

According to this aspect, the second power supply line is substantially tabular in planar view. With this, the second power supply line can be a tabular line with a width wider than the width of the first power supply line. Thus, it is possible to reduce the line resistance in the second power supply line. Thus, the power is supplied from the second power supply line with low line resistance to the second electrode through the first power supply line. Thus, with respect to the IR drop generated along the increase in screen size of the display apparatus in the central region of the display area, it is possible to significantly reduce the IR drop amount.

Furthermore, in an aspect of the EL display panel according to the present invention, it is preferable that the semiconductor layer is of N-channel type, and at least part of the second power supply line is arranged not to overlap the semiconductor layer.

According to this aspect, the N-channel type semiconductor layer is formed not to overlap the second power supply line, thereby suppressing the induced carriers in the back channel. With this, it is possible to suppress the generation of off-leakage current. Thus, it is possible to implement an EL display panel with a thin film transistor with good off-characteristics.

Furthermore, in an aspect of the EL display panel according to the present invention, it is preferable that the semiconductor layer is of P-channel type, and at least part of the second power supply line is arranged to overlap the semiconductor layer.

According to this aspect, the P-channel type semiconductor layer is formed to overlap the second power supply line, thereby stabilizing electric potential at the back channel. With this, it is possible to suppress the generation of off-leakage current. Thus, it is possible to implement an EL display panel with a thin film transistor with good off-characteristics.

Furthermore, in an aspect of the EL display panel according to the present invention, the first electrode is a source electrode, and the second electrode is a drain electrode. According to an aspect of the EL display panel according to the present invention, the first electrode may be a drain electrode, and the second electrode may be a source electrode.

Furthermore, in an aspect of the EL display panel according to the present invention, it is preferable that capacitance per unit area formed by the first interlayer insulating film interposed between a layer in which the gate line is formed and a layer in which the first power supply line is formed is smaller than capacitance per unit area formed by the gate insulating film interposed between the layer in which the gate electrode is formed and the layer in which the first power supply line is formed. In this case, in an aspect of the EL display panel according to the present invention, it is preferable that capacitance formed in the first interlayer insulating film is less than $1.5 \times 10\text{-}4$ F/m2, and capacitance formed in the gate insulating film is $1.5 \times 10\text{-}4$ F/m2 or greater.

According to this aspect, when the first interlayer insulating film and the gate insulating film are formed by the same material, the thickness of the first interlayer insulating film is greater than the thickness of the gate insulating film. With this, it is possible to set the interval between the gate line on the first interlayer insulating film and the first power supply line under the first interlayer insulating film equal to or greater than the thickness of the gate insulating film. This further decreases the parasitic capacitance between the gate line and the first power supply line.

Furthermore, in an aspect of the EL display panel according to the present invention, it is preferable that the semiconductor layer includes a polycrystalline semiconductor layer.

According to this aspect, the polycrystalline semiconductor film further increases mobility of the carriers, and thus, it is possible to implement an EL display panel including a thin film transistor with good ON characteristics.

Furthermore, in an aspect of the EL display panel according to the present invention, it is preferable that material composing the second power supply line and the auxiliary line includes one element selected from among Al, Cu, and Ag. Furthermore, in an aspect of the EL display panel according to the present invention, it is preferable that the second power supply line and the auxiliary line are multilayered lines, and main lines composing the second power supply line and the auxiliary line are made of one element selected from among Al, Cu, and Ag.

Furthermore, it is possible to form the second power supply line using metal material with low resistivity among materials for lines, thereby further reducing the electrical resistance of the second power supply line.

Furthermore, in an aspect of the EL display panel according to the present invention, it is preferable that the EL unit is an organic EL unit having an organic light-emitting layer as the light-emitting layer.

According to this aspect, it is possible to implement an organic EL display panel with high display capability.

In addition, an aspect of the EL display apparatus according to the present invention includes the EL display panel.

According to this aspect, it is possible to implement an organic EL display panel with high display capability.

An aspect of the EL display panel according to the present invention includes a first process of preparing a substrate; a second process of forming a gate electrode above the substrate; a third process of forming a gate insulating film above the substrate to cover the gate electrode; a fourth process of forming a semiconductor layer on the gate insulating film and above the gate electrode; a fifth process of forming a first electrode above the semiconductor layer and forming, in a same layer as the first electrode, a second electrode and a first power supply line electrically connected to the second electrode; a sixth process of forming a first interlayer insulating film above the gate insulating film to cover the first electrode and the second electrode; a seventh process of forming a first contact hole through the gate insulating film and the first interlayer insulating film, and forming a second contact hole through the first interlayer insulating film; an eighth process of forming, by forming a metal film above the first interlayer insulating film and patterning the metal film, (i) a gate line electrically connected to the gate electrode through the first contact hole and crossing the first power supply line, (ii) a second power supply line electrically connected to the first power supply line through the second contact hole and side-by-side with the gate line, and (iii) an auxiliary line side-by-side with the second power supply line; a ninth process of forming a second interlayer insulating film to cover upper surfaces of the first interlayer insulating film, the second power supply line, and the auxiliary line; a tenth process of forming a third contact hole through the second interlayer insulating film above the auxiliary electrode; and an eleventh process of forming, above the second interlayer insulating film, an EL unit including an anode electrode, a cathode electrode, and a light-emitting layer interposed between the anode electrode and the cathode electrode, in which, in the eleventh process, the cathode electrode and the auxiliary line are electrically connected through the third contact hole.

According to this aspect, the EL display panel according to the present invention can be easily manufactured.

Furthermore, in an aspect of the EL display panel according to the present invention, it is preferable that the semiconductor layer formed in the fourth process is a non-crystalline semiconductor film, and that the method further includes, between the fourth process and fifth process, a process of crystallizing the non-crystalline semiconductor film by irradiating the non-crystalline semiconductor film with a laser to heat the non-crystalline semiconductor film to a predetermined temperature range.

According to this aspect, it is possible to form a semiconductor layer including the polycrystalline semiconductor film, and to manufacture an EL display panel with good ON characteristics.

Furthermore, in an aspect of the EL display panel according to the present invention, it is preferable that the EL unit is an organic EL unit having an organic light-emitting layer as the light-emitting layer.

According to this aspect, it is possible to manufacture an organic EL display panel with high display capability.

The following describes embodiments and examples of an EL display panel, a manufacturing method of an EL display panel, and an EL display apparatus with reference to the drawings. Note that the diagrams are schematic for explanation purpose, and ratios such as thicknesses and size of the components are not always strictly accurate.

First Embodiment

First, the organic electro-luminescence (EL) panel according to the first embodiment of the present invention shall be described with reference to FIG. 1. FIG. 1 is a partial cutout perspective view of an organic EL display panel according to the first embodiment of the present invention.

As illustrated in FIG. 1, the EL display panel 1 according to the first embodiment of the present invention is an organic EL display panel (organic EL display), and includes an organic EL device 10 which is a light-emitting display device, and a thin film semiconductor array device 20 composed of an active matrix substrate on which a thin film transistor and lines are formed.

The organic EL device 10 includes a lower electrode 12, an organic light-emitting layer 13, and an upper electrode 14 that are sequentially formed on the thin film semiconductor array device 20. The organic light-emitting layer 13 is composed of an electron transport layer, a light-emitting layer, and a hole transport layer, and others.

The thin film semiconductor array device 20 includes a pixel unit in which pixels 100 are arranged in a matrix (in rows and columns), and each of the pixel 100 includes a pixel circuit 30 including a thin film transistor (not illustrated). The thin film semiconductor array device for display apparatus 20 includes gate lines 21 and source lines 22 arranged in a matrix. Multiple metal lines are arranged in row direction as the gate lines 21, and multiple metal lines are arranged in column direction as the source lines 22. In addition, the gate lines 21 and the source lines 22 are orthogonal to each other, and each of them is connected to each pixel circuit 30 and a control circuit (not illustrated).

Each pixel circuit 30 includes at least two thin film transistors are provided as a switching device for selecting the pixel 100 and a driving device for driving the organic EL device 10.

Note that, although not illustrated in FIG. 1, the thin film semiconductor array device for display apparatus 20 includes first power supply lines 23A arranged in column direction and second power supply lines 23B arranged in row direction. The first power supply lines 23A are arranged in parallel with the source lines 22 and connected to driving devices of pixels 100.

As such, the organic EL display panel 1 according to the first embodiment utilizes active matrix technology in which display control is performed for each pixel 100 partitioned by the gate lines 21 and the source lines 22.

Figure 2:
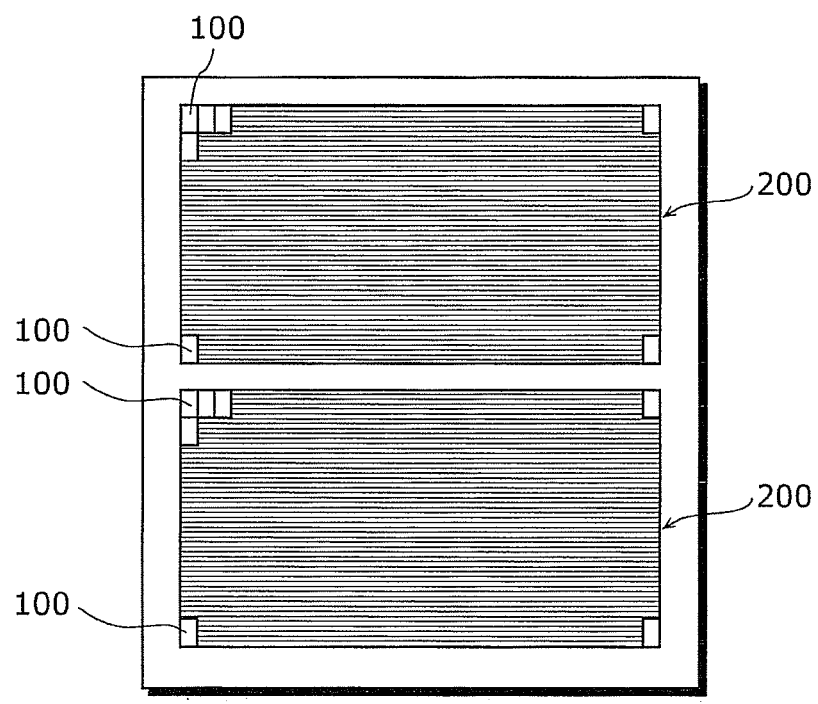
FIG. 2 illustrates a mother board of the thin film semiconductor array device for display apparatus according to the first embodiment of the present invention.

Next, an example of manufacturing the thin film semiconductor array device for display apparatus according to the first embodiment of the present invention shall be described with reference to FIG. 2. FIG. 2 illustrates a mother board of the thin film semiconductor array device for display apparatus according to the first embodiment of the present invention. As illustrated in FIG. 2, the mother board includes two display units 200, and two thin film semiconductor array devices for display apparatus 20 are obtained by cutting the mother board into two pieces. As described above, each display unit 200 includes the pixels 100 arranged in a matrix (in rows and columns). Note that, in FIG. 2, only the pixels 100 at the corners of the display unit 200 are illustrated. In FIG. 2, it is assumed that the mother board includes two display units 200, and an example in which two displays are obtained from one mother board. However, the display unit 200 may be more than one, or only one.

Figure 3:
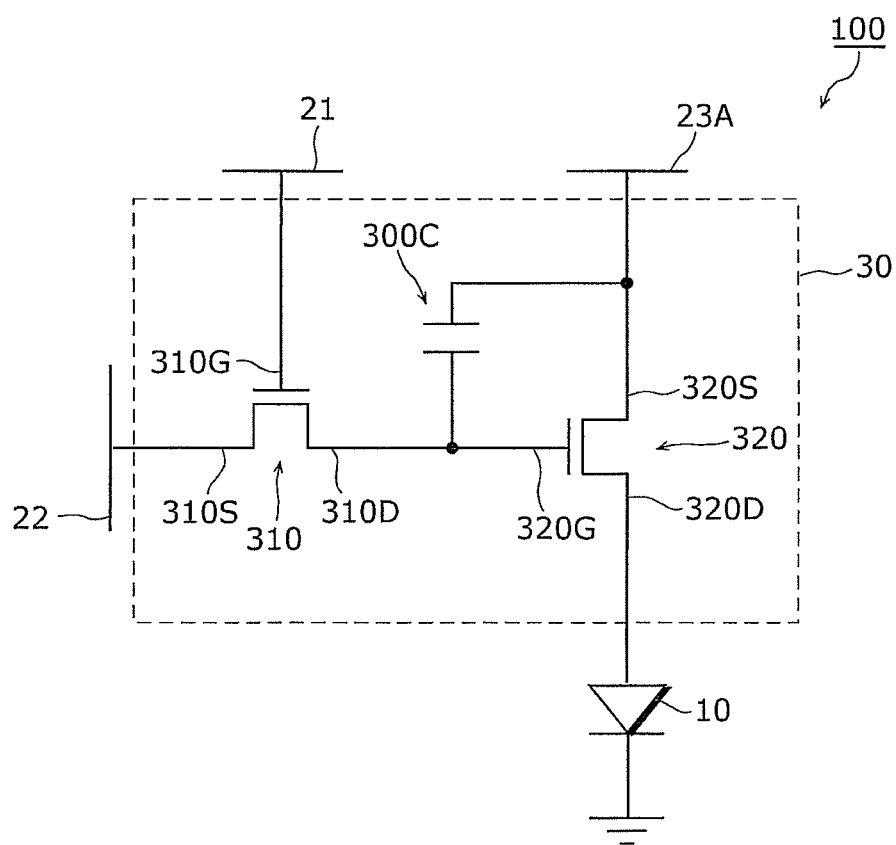
FIG. 3 illustrates a circuit configuration of one pixel in an EL display panel according to the first embodiment of the present invention.

The following describes the circuit configuration of the pixel in the EL display panel according to the first embodiment of the present invention with reference to FIG. 3. FIG. 3 illustrates a circuit configuration of one pixel in an EL display panel according to the first embodiment of the present invention. In the first embodiment illustrated in FIGS. 3 to 15, description is made using P-channel TFTs as an example of the first thin film transistor and the second thin film transistor.

As illustrated in FIG. 3, each pixel 100 includes: a pixel circuit 30 including a first thin film transistor 310, a second thin film transistor 320, and a capacitor 300C; and an organic EL device 10. The first thin film transistor 310 is a selector transistor for selecting the pixel 100 (switching transistor), and the second thin film transistor 320 is a driver transistor for driving the organic EL device 10.

The first thin film transistor 310 includes a first source electrode 310S, a first drain electrode 310D, and a first gate electrode 310G. The first source electrode 310S is connected to the source line 22, and the first gate electrode 310G is connected to the gate line 21. Furthermore, the first drain electrode 310D is connected to the capacitor 300C and the second gate electrode 320G of the second thin film transistor 320. When voltage is applied to the gate line 21 and the source line 22, the first thin film transistor 310 stores the voltage value applied to the source line 22 in the capacitor 300C as display data.

The second thin film transistor 320 includes a second source electrode 320S, a second drain electrode 320D, and a second gate electrode 320G. The second drain electrode 320D is connected to the anode (lower electrode) of the organic EL device 10, and the second source electrode 320S is connected to the first power supply line 23A. The second gate electrode 320G is connected to the first drain electrode 310D of the first thin film transistor 310. The second thin film transistor 320 supplies current corresponding to the voltage value held by the capacitor 300C to the anode of the organic EL device 10 through the second drain electrode 320D from the first power supply line 23A.

In the pixel 100 with the configuration described above, when the gate line 21 receives a gate signal turning on the first thing film transistor 310, the signal voltage supplied through the source line 22 is written in the capacitor 300C. The hold voltage written in the capacitor 300C is held for one frame period. With the hold voltage, the conductance of the second thin film transistor 320 changes in an analog manner, and the driving current corresponding to luminescence gradation flows from the anode to the cathode of the organic EL device 10. As such, the organic EL device 10 emits light, and an image is displayed.

Figure 4A:
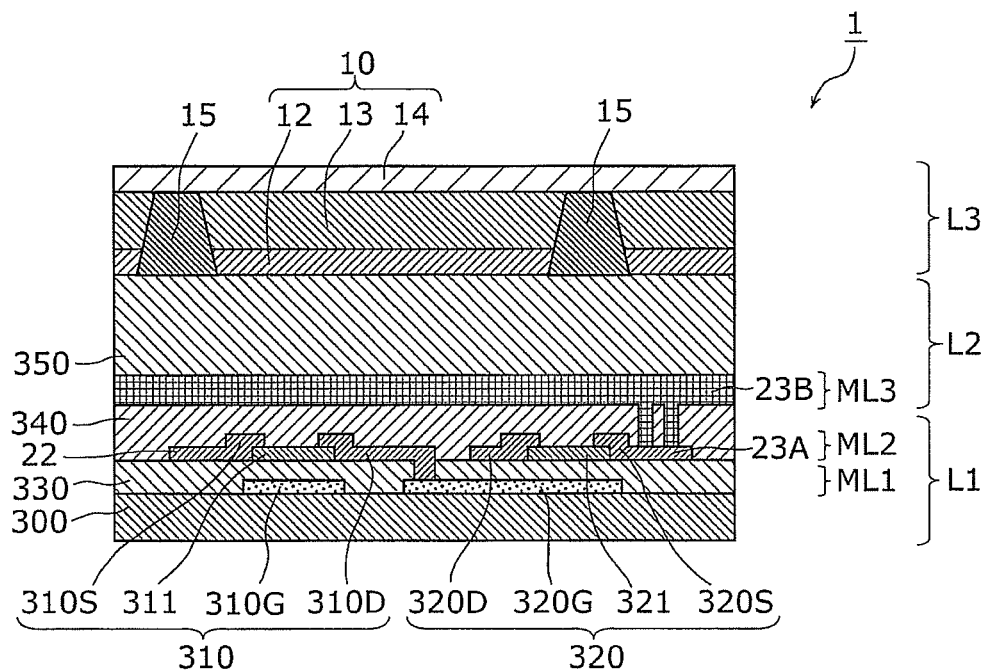
FIG. 4A is a schematic cross-sectional view of a cross sectional surface including a thin film transistor in a pixel of the EL display panel according to the first embodiment of the present invention.
Figure 4B:
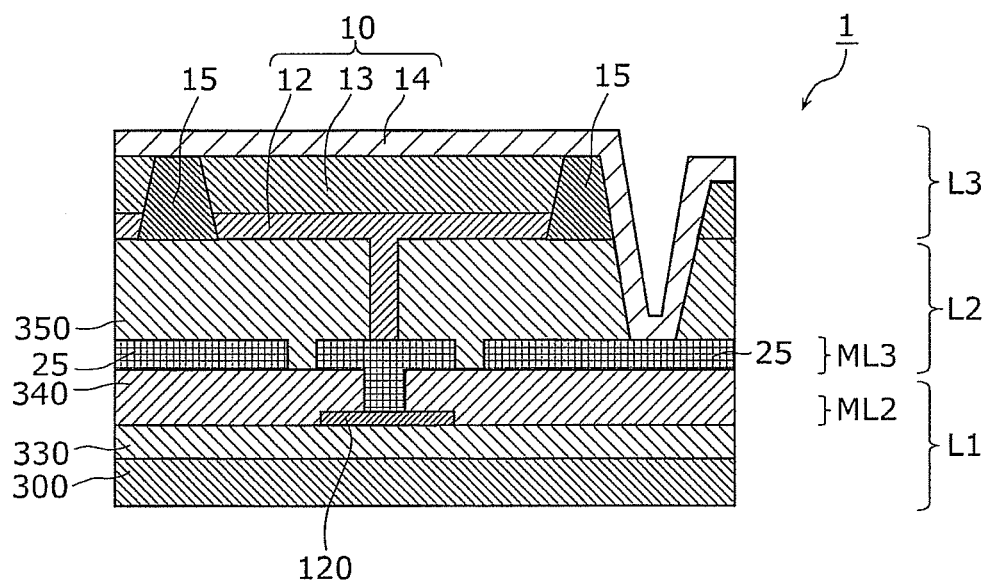
FIG. 4B is a schematic cross-sectional view of a cross-sectional surface including an auxiliary line in a pixel of the EL display panel according to the first embodiment of the present invention.

Next, the configuration of a pixel in the EL display panel 1 according to the first embodiment of the present invention shall be described with reference to FIGS. 4A and 4B. FIG. 4A is a cross-sectional diagram schematically illustrating a cross-sectional surface including the thin film transistor in one pixel of the EL display panel according to the first embodiment of the present invention. FIG. 4B is a cross-sectional diagram schematically illustrating a cross-sectional surface including the auxiliary line in one pixel of the EL display panel according to the first embodiment of the present invention.

As illustrated in FIG. 4A, each pixel included in the EL display panel 1 according to the first embodiment of the present invention includes the first thin film transistor 310 which is a switching transistor for selecting the pixel, and the second thin film transistor 320 which is a driving transistor for driving the organic EL device 10. As described above, the first thin film transistor 310 includes the first source electrode 310S, the first drain electrode 310D, and the first gate electrode 310G. The second thin film transistor 320 includes the second source electrode 320S, the second drain electrode 320D, and the second gate electrode 320G.

As illustrated in FIG. 4A, the first gate electrode 310G and the second gate electrode 320G are formed in each pixel above the substrate 300. Furthermore, the gate insulating film 330 is formed to cover the first gate electrode 310G and the second gate electrode 320G.

The first semiconductor layer 311 is formed above the first gate electrode 310G and on the gate insulating film 330. The second semiconductor layer 321 is formed above the second gate electrode 320G and on the gate insulating film 330.

One pair of the first source electrode 310S and the first drain electrode 310D are separately arranged opposite to each other, each covering part of the first semiconductor layer 311. One pair of the second source electrode 320S and the second drain electrode 320D are separately arranged opposite to each other, each covering part of the second semiconductor layer 321.

The first source electrode 310S of the first thin film transistor 310 is electrically connected to the source line 22. The second source electrode 320S of the second thin film transistor 320 is electrically connected to the first power supply line 23A.

In addition, the first interlayer insulating film (lower interlayer insulating film) 340 is formed to cover the first thin film transistor 310 and the second thin film transistor 320. The first interlayer insulating film 340 serves as a passivation film for protecting the first thin film transistor 310 and the second thin film transistor 320, for example.

The second power supply line 23B is formed on the first interlayer insulating film 340. The second power supply line 23B is electrically connected to the first power supply line 23A through a contact hole formed in the first interlayer insulating film 340.

The second interlayer insulating film (upper interlayer insulating film) 350 is formed on the first interlayer insulating film 340 to cover the second power supply line 23B. The second interlayer insulating film 350 serves as a planarizing film for planarizing an upper surface of the thin film semiconductor device for display apparatus (thin film semiconductor unit), for example. As such, a flat organic EL device 10 is formed thereon.

The organic EL device 10 including the lower electrodes 12, the organic light emitting layer 13 and the upper electrode 14 that are sequentially formed is formed on the second interlayer insulating film 350. The bank 15 is formed on the second interlayer insulating film 350 at the boundary of adjacent pixels. The lower electrode 12 and the organic light emitting layer 13 are formed in the opening between adjacent banks 15.

Each lower electrode 12 is an anode electrode arranged for each pixel, and is formed on the second interlayer insulating film 350. The lower electrode 12 is electrically connected to the second drain electrode 320D of the second thin film transistor through the contact hole through the first interlayer insulating film 340 and the second interlayer insulating film 350.

The organic light emitting layer (organic EL layer) 13 is formed for each color (sub-pixel column) or each sub pixel, and is made of a predetermined organic luminescent material.

The upper electrode 14 is a cathode electrode formed above the organic light emitting layer 13 over multiple pixels, and is made of a transparent electrode such as ITO. In this embodiment, the upper electrode 14 is a common electrode shared by all of the pixels. Note that, the upper electrode 14 has a ground potential.

Furthermore, as illustrated in FIG. 4B, the auxiliary lines 25 are formed on the first interlayer insulating film 340. The auxiliary lines 25 are electrically connected to the upper electrode 14 of the organic EL device 10, and prevents voltage drop in a central region of the display screen of the upper electrode 14. The auxiliary lines 25 are capable of functioning as an EL power supply line which applies a predetermined power supply to the upper electrode 14.

Note that, in this embodiment, no auxiliary line electrically connected to the upper electrode 14 is formed in the organic EL layer L3.

The electrode portion 120 extends from the second drain electrode 320D of the second thin film transistor 320. As illustrated in FIG. 4B, the electrode portion 120 is electrically connected to the lower electrode 12 of the organic EL device 10 through the relay electrode. With this, the second drain electrode 320D of the second thin film transistor 320 and the lower electrode 12 are electrically connected.

In the EL display panel with the structure described above, the lowermost layer in which the thin film transistor is formed is referred to as a TFT layer (TFT unit) L1, the uppermost layer in which the organic EL device 10 is formed is referred to as the organic EL layer (organic EL unit) L3, and the layer between the TFT layer L1 and the organic EL layer L3 and in which the line is formed is referred to as a line layer (line portion) L2. In this line layer L2, the second power supply line 23B, the auxiliary line 25 and others are formed as illustrated in FIGS. 4A and 4B, for example. In addition, in this embodiment, the thin film semiconductor unit is composed of the TFT layer L1 and the line layer L2.

Furthermore, in the TFT layer L1, the layer in which the first gate electrode 310G and the second gate electrode 320G are formed is referred to as a first metal layer ML1. In addition, a layer in which a pair of first source electrode 310S and the first drain electrode 310D and a pair of the second source electrode 320S and the second drain electrode 320D are formed is referred to as a second metal layer ML2. Accordingly, as illustrated in FIGS. 4A and 4B, in this embodiment, the source line 22 is formed in the second metal layer ML2.

In the line layer L2, a layer in which the power supply line 23 is formed is referred to as a third metal layer ML3. Note that, as described later, the gate line 21 is also formed in the third metal layer ML3 in addition to the second power supply line 23B and the auxiliary line 25.

In the first metal layer ML1 to the third metal layer ML3, the metal material such as the electrodes and the line formed in the same metal layer can be formed by patterning the same metal film.

Figure 5:
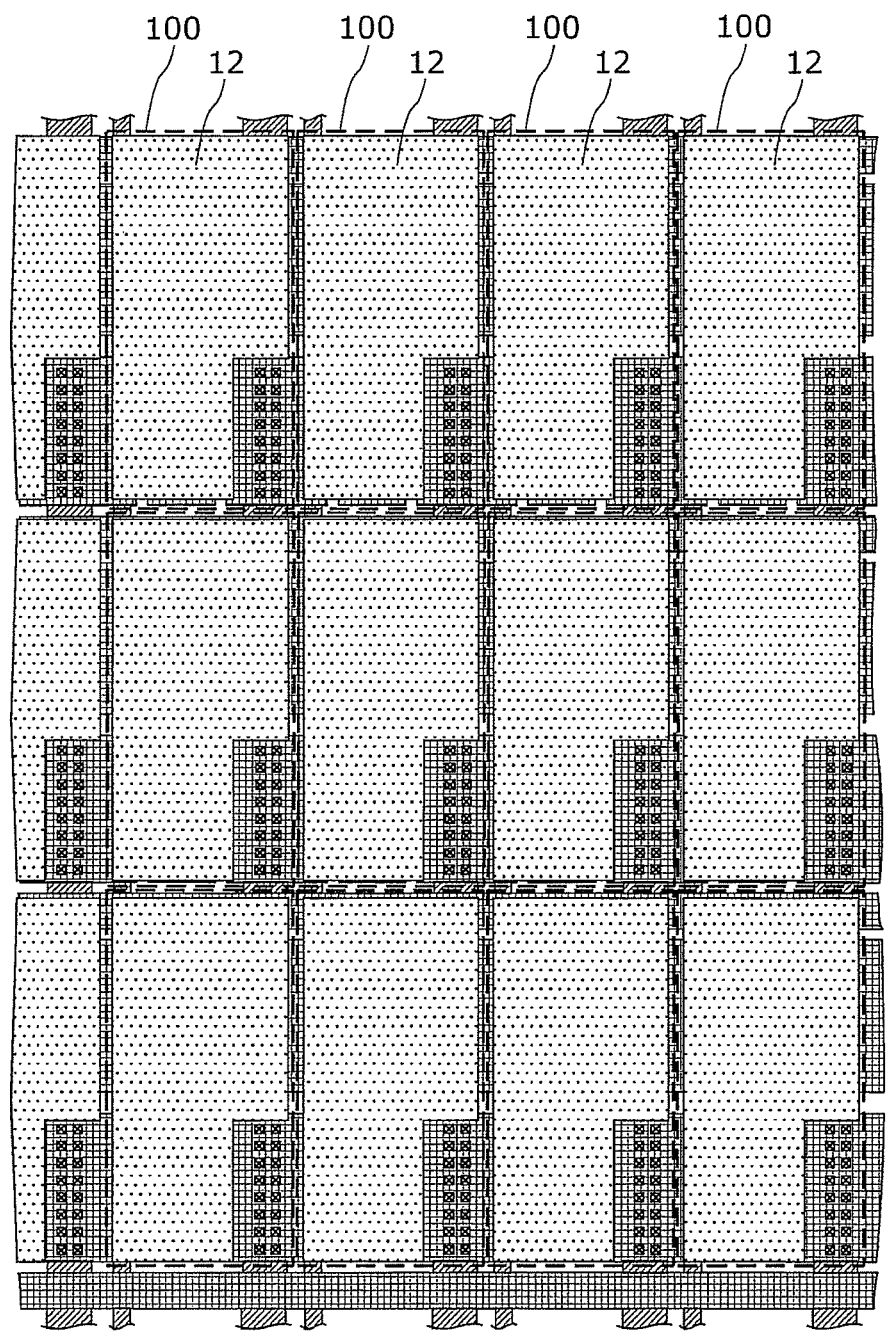
FIG. 5 is a planar view of the EL display panel (partially see-through) according to the first embodiment of the present invention.
Figure 6:
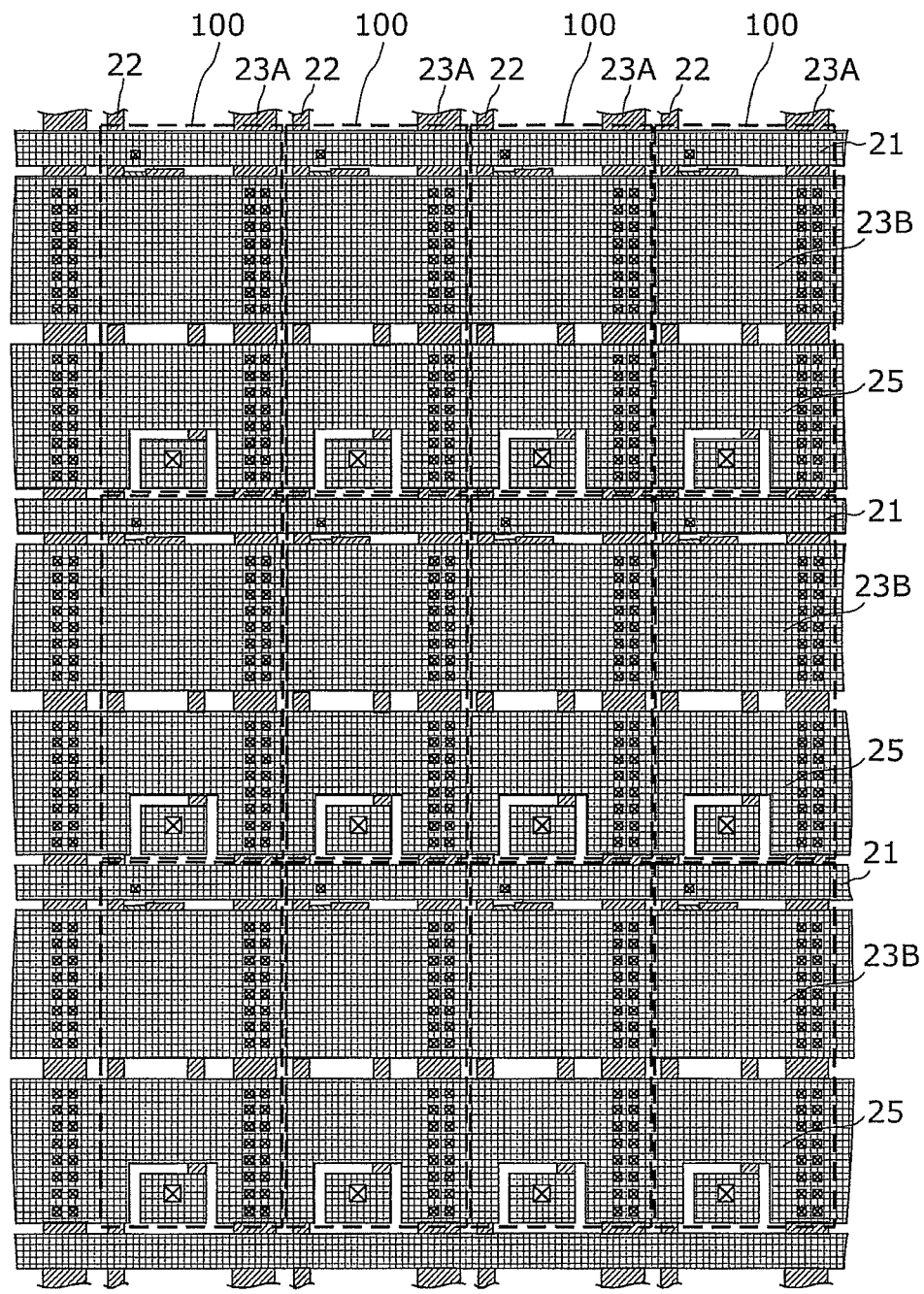
FIG. 6 is a planar view of the EL display panel (partially see-through) according to the first embodiment of the present invention.
Figure 7:
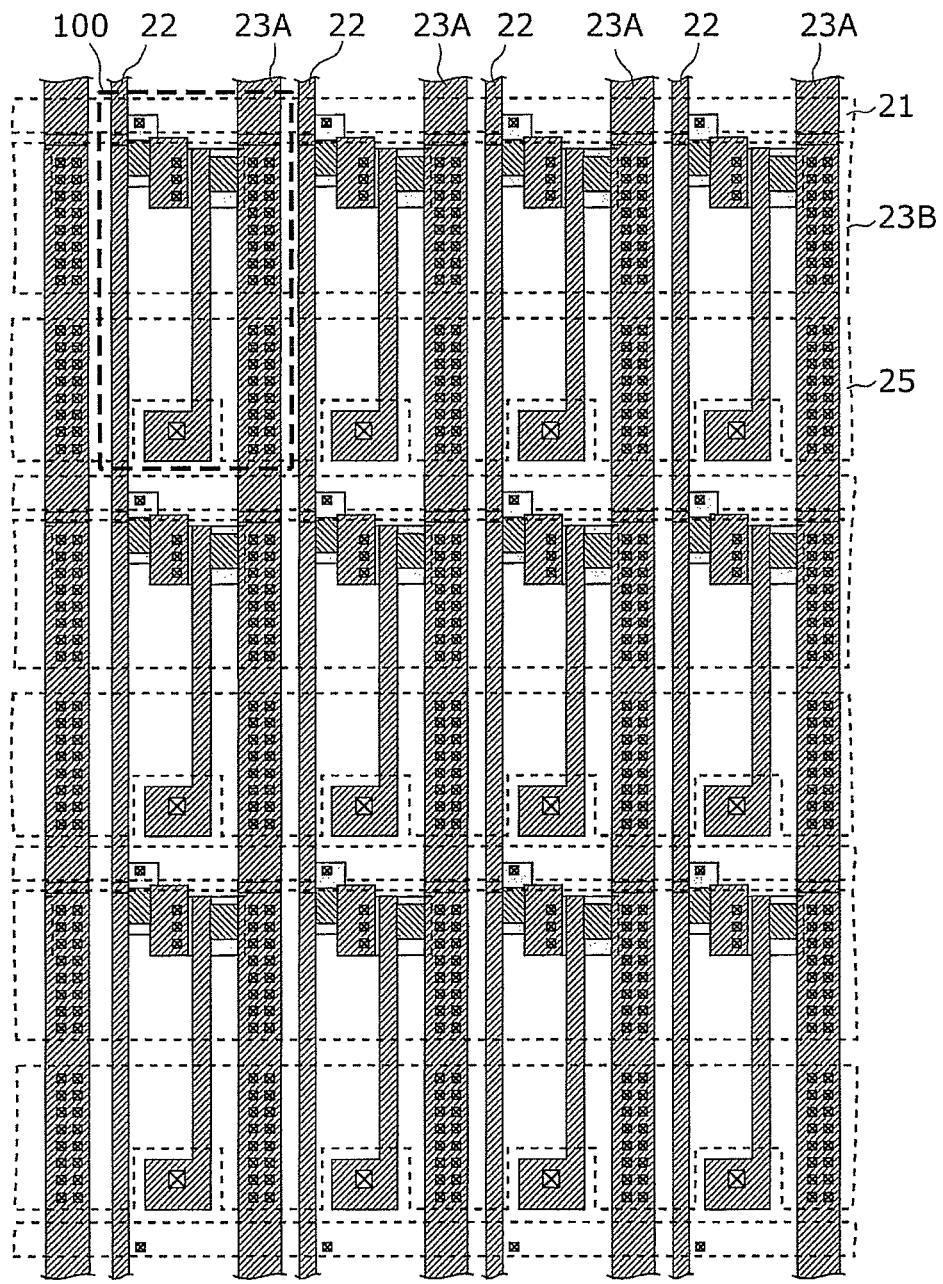
FIG. 7 is a planar view of the EL display panel (partially see-through) according to the first embodiment of the present invention.

Next, the EL display panel 1 according to the first embodiment of the present invention shall be described with reference FIGS. 5 to 7. FIG. 5 is a planar view of the EL display panel according to the first embodiment of the present invention illustrating the components, seeing through the upper electrode and the light emitting layer of the organic EL device 10. FIG. 6 is a planar view of the EL display penal according to the first embodiment of the present invention, illustrating the components, seeing through the organic EL layer L3 and the second interlayer insulating film. FIG. 7 is a planar view of the EL display panel according to the first embodiment of the present invention, illustrating the components, seeing through the organic EL layer L3, the line layer L2, and the first interlayer insulating film.

As illustrated in FIG. 5, the EL display panel 1 according to the first embodiment of the present invention includes pixels arranged in a matrix (rows and columns), and a lower electrode 12 is arranged for each pixel 100.

As illustrated in FIG. 6, the gate lines 21, the second power supply lines 23B, and the auxiliary lines 25 are arranged in parallel.

The second power supply line 23B and the auxiliary line 25 are arranged between adjacent gate line 21, and the second power supply line 23B and the auxiliary line 25 are formed in the same layer as the gate line 21 and side-by-side with the gate line 21.

Note that, the gate line 21, the second power supply line 23B and the auxiliary line 25 are formed in the third metal layer ML3 in the line layer L2 illustrated in FIGS. 4A and 4B. The gate line 21, the second power supply line 23B and the auxiliary line 25 are formed on the first interlayer insulating film 340 (not illustrated).

FIG. 7 illustrates the components in FIG. 6 with the gate lines 21, the second power supply lines 23B and the auxiliary lines 25 transmitted. Note that, in FIG. 6, the regions in which the gate line 21, the second power supply 23B and the auxiliary line 25 are formed are indicated in broken lines.

As illustrated in FIG. 7, the EL display apparatus 1 according to the first embodiment of the present invention includes the source lines 22 and the first power supply lines 23A arranged along the column direction of the pixels 100 in parallel.

The first power supply lines 23A and the source lines 22 is formed in the second metal layer ML2 in the TFT layer L1 illustrated in FIG. 4A, and are arranged to three-dimensionally cross the gate lines 21, the second power supply lines 23B and the auxiliary line 25 formed in the line layer L2 which is the upper layer.

Figure 8:
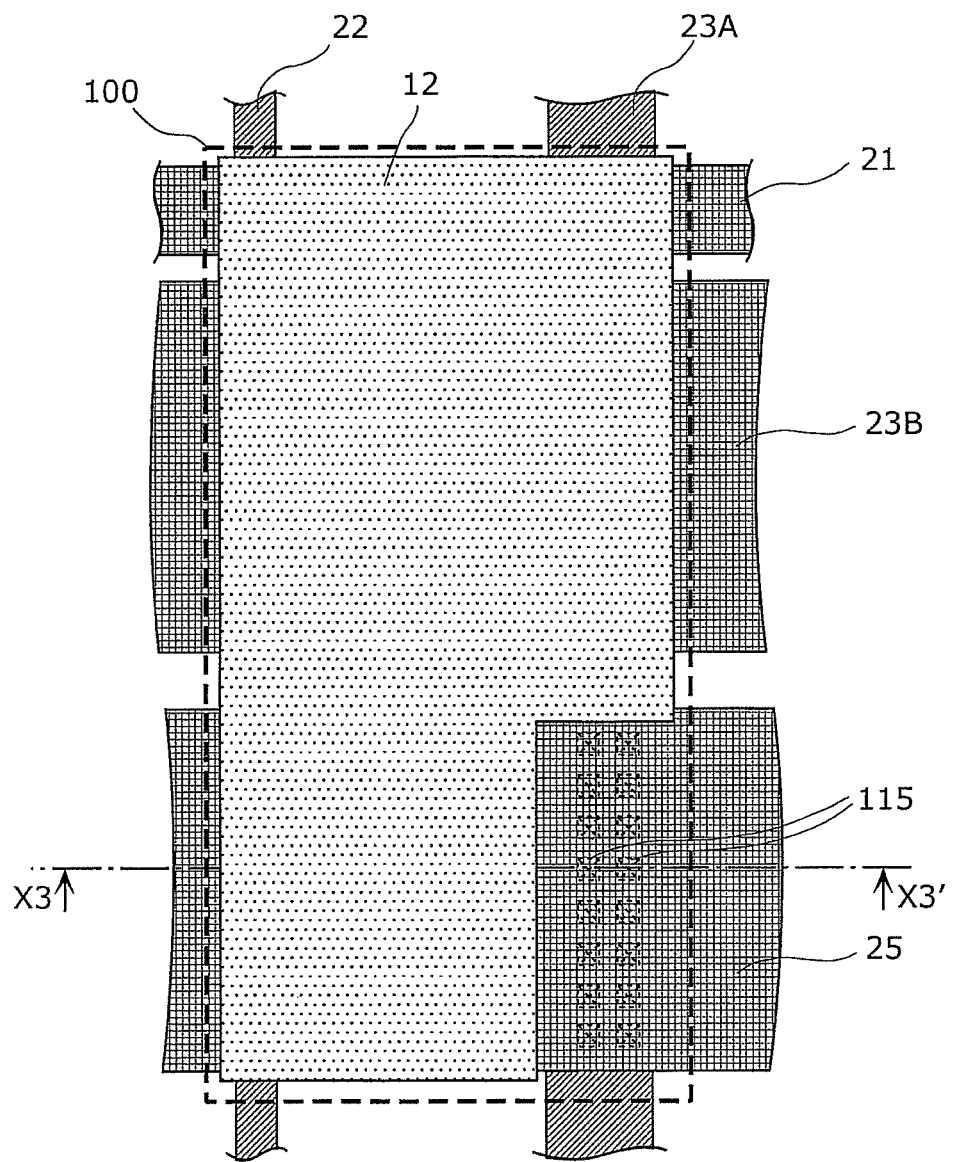
FIG. 8 is a planar view of the EL display panel (partially see-through) according to the first embodiment of the present invention.
Figure 9:
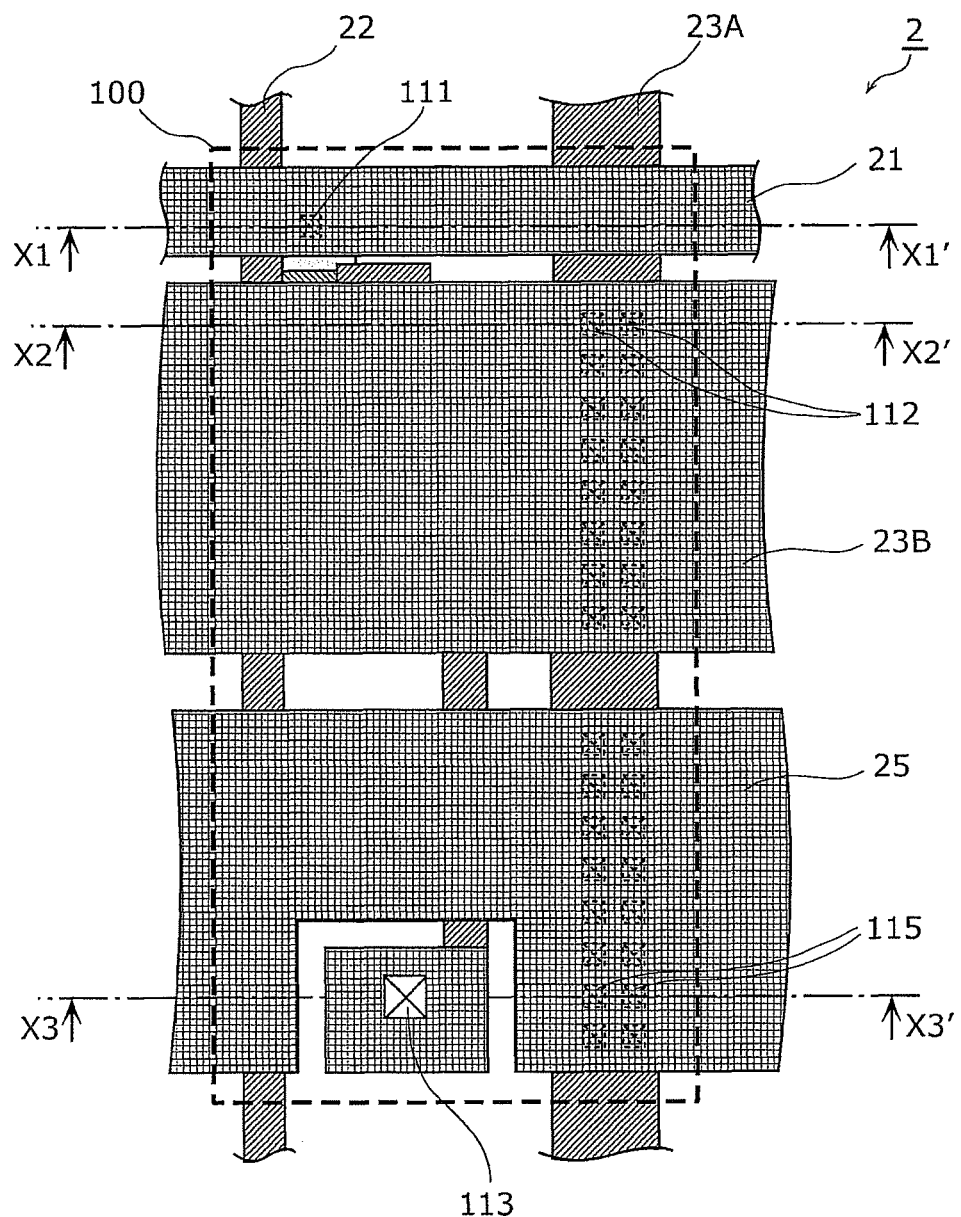
FIG. 9 is a planar view of the EL display panel (partially see-through) according to the first embodiment of the present invention.
Figure 10:
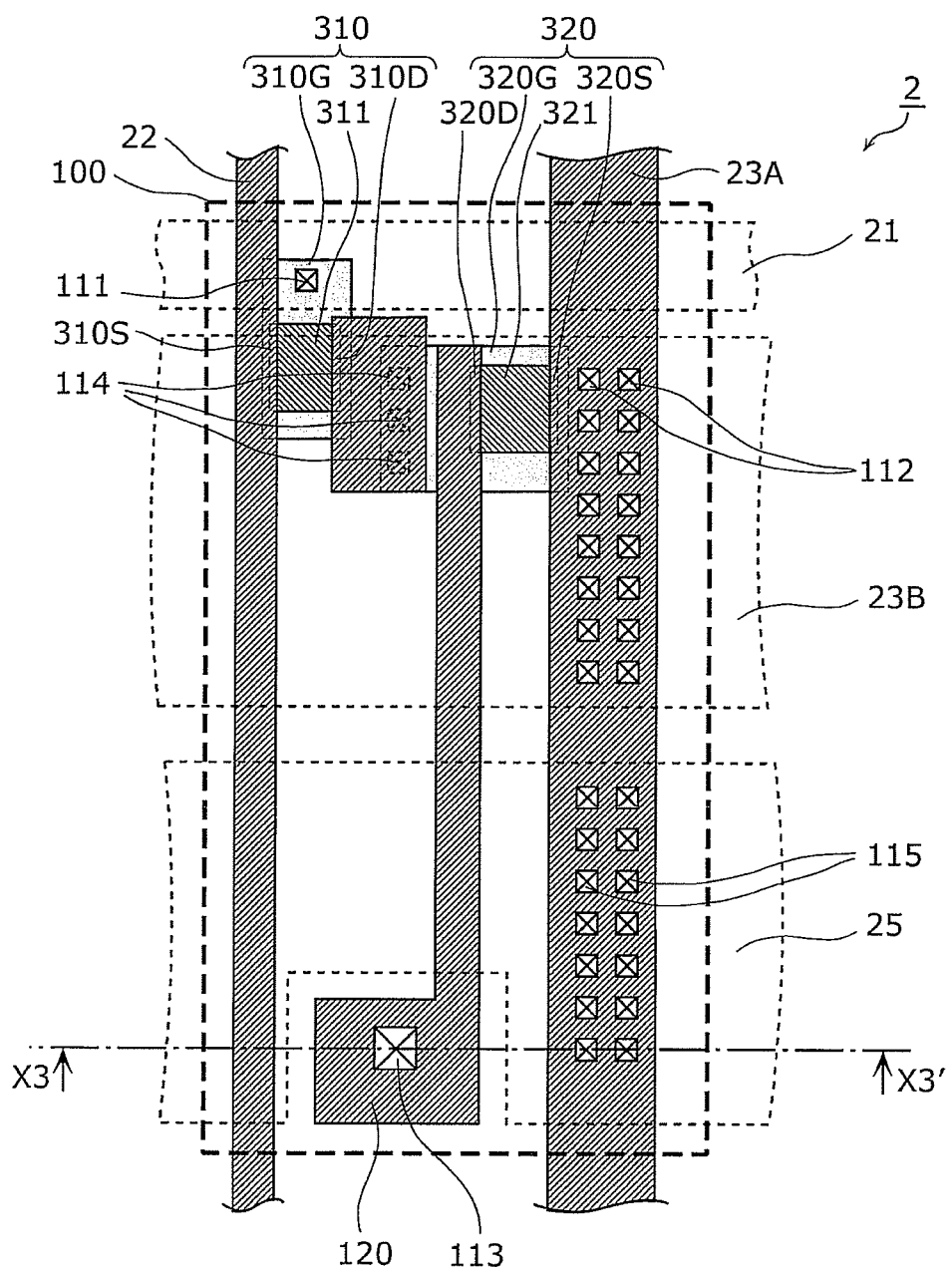
FIG. 10 is a planar view of the EL display panel (partially see-through) according to the first embodiment of the present invention.
Figure 11A:
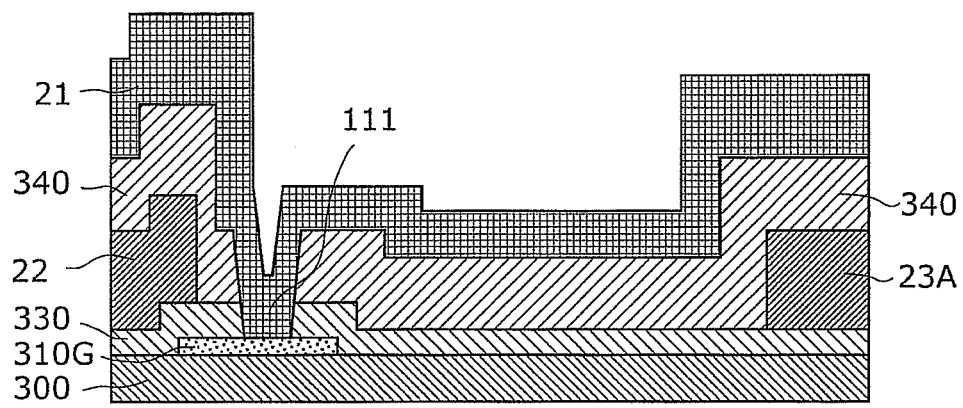
FIG. 11A is a cross-sectional view of the EL display panel according to the first embodiment of the present invention (a cross-sectional view along X1-X1' in FIG. 9)
Figure 11B:
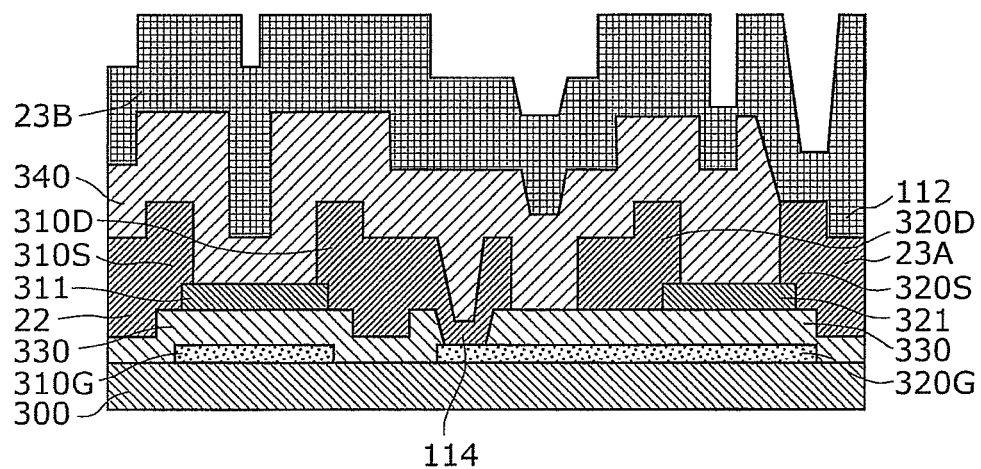
FIG. 11B is a cross-sectional view of the EL display panel according to the first embodiment of the present invention (a cross-sectional view along X2-X2' in FIG. 9)
Figure 11C:
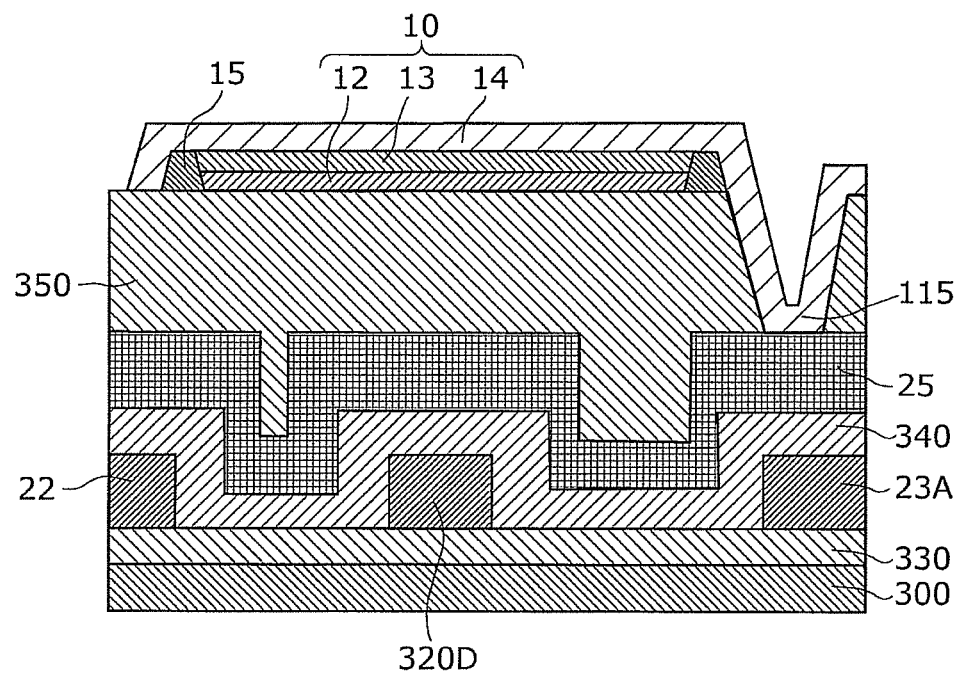
FIG. 11C is a cross-sectional view of the EL display panel according to the first embodiment of the present invention (a cross-sectional view along X3-X3' in FIG. 8)
Figure 12A:
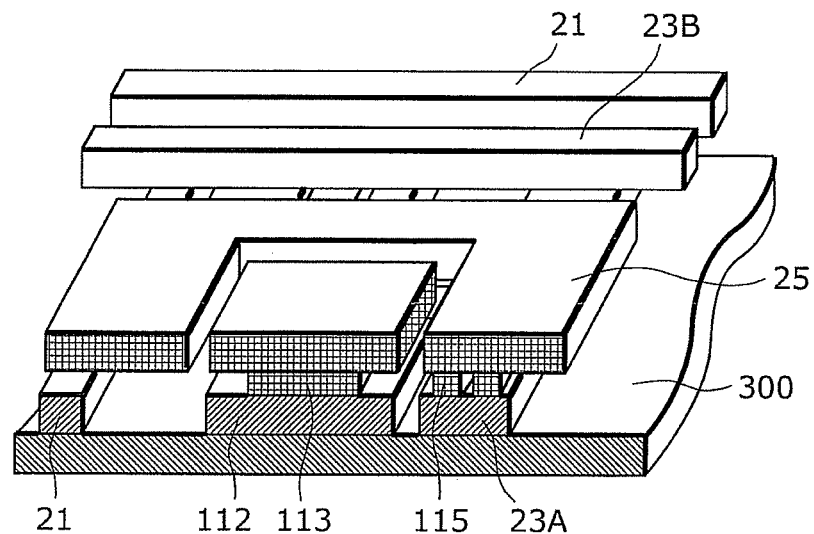
FIG. 12A is a perspective view of the EL display panel according to the first embodiment of the present invention in a cross-sectional surface along X4-X4' in FIG. 9.
Figure 12B:
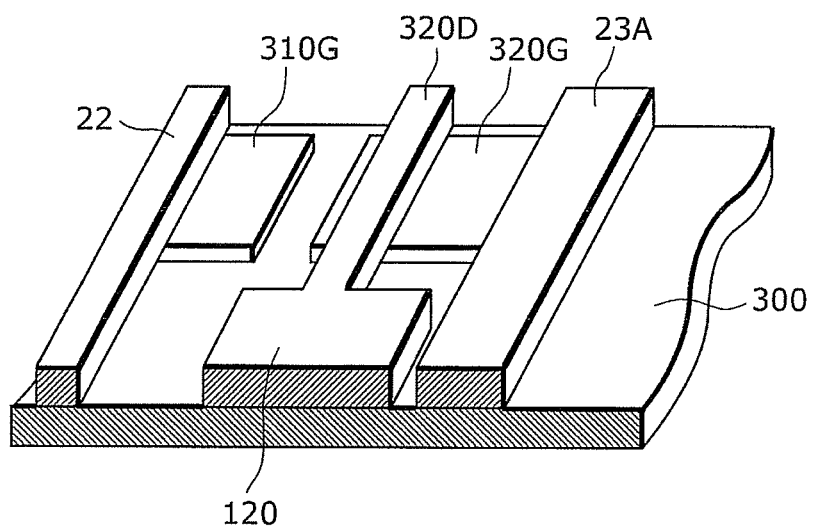
FIG. 12B is a perspective view of the EL display panel according to the first embodiment of the present invention in a cross-sectional surface along X3-X3' in FIG. 10.

Next, the detailed configuration of the pixel 100 in FIGS. 5 to 7 shall be described with reference to FIGS. 8 to 10, 11A, 11B, 11C, 12A and 12B. FIGS. 8 to 10 correspond to each of the pixels 100 in FIGS. 5 to 7, respectively, and are planar views of the EL display panel according to the first embodiment of the present invention. FIG. 11A is a cross sectional view along X1 to X1' in FIG. 9, FIG. 11B is a cross sectional view along X2 to X2', and FIG. 11C is a cross sectional view along X3-X3' in FIG. 8. FIG. 12A is a perspective view of the EL display panel according to the first embodiment of the present invention along the cross sectional surface along X4-X4' in FIG. 9. FIG. 12B is a perspective view of the EL display panel according to the first embodiment of the present invention along the cross sectional surface along X3-X3' in FIG. 10.

As illustrated in FIGS. 8 to 10, the EL display panel 1 according to the first embodiment of the present invention includes the thin film semiconductor device for display apparatus including a substrate 300, a first thin film transistor 310, the second thin film transistor 320, a gate line 21, a source line 22, a first power supply line 23A, a second power supply line 23B, an auxiliary line 25, and a first interlayer insulating film 340.

The first thin film transistor 310 is a multilayered structure of a first gate electrode 310G, a gate insulating film 330, a first semiconductor layer 311 (channel layer), one pair of the first source electrode 310S and the first drain electrode 310D. The second thin film transistor 320 is a multilayered structure of the second gate electrode 320G, the gate insulating film 330, the second semiconductor layer 321 (channel layer), one pair of the second source electrode 320S and the second drain electrode 320D.

In this embodiment, the first thin film transistor 310, the second thin film transistor 320, the source line 22 and the first power supply line 23A are formed in the TFT layer L1 illustrated in FIG. 4A. Furthermore, the gate line 21, the second power supply line 23B and the auxiliary line 25 are formed in the line layer L2 illustrated in FIGS. 4A and 4B.

The following specifically describes the components of the EL display panel 1 according to the first embodiment of the present invention from the component in the lowermost layer.

As illustrated in FIGS. 10, 11A, 11B, and 12B, the first gate electrode 310G and the second gate electrode 320 are patterned in island shape above the substrate 300. The first gate electrode 310G and the second gate electrode 320G are formed in the first metal layer ML1 illustrated in FIG. 4A.

The gate insulating film 330 is formed on the substrate 330 to cover the first gate electrode 310G and the second gate electrode 320G as illustrated in FIGS. 11A and 11B. Furthermore, the gate insulating film 330 is formed on the entire surface of the substrate 300 except for the region in which the contact holes are formed.

The first semiconductor layer 311 is patterned in island shape on the gate insulating film 330 and above the first gate electrode 310G, as illustrated in FIGS. 10 and 11B. Furthermore, the second semiconductor layer 321 is patterned on the gate insulating film 330 and above the second gate electrode 320G.

Note that, the first semiconductor layer 311 and the second semiconductor layer 321 may be N-channel type or P-channel type. In this embodiment, the first semiconductor layer 311 and the second semiconductor layer 321 is covered by the second power supply line 23B with the positive electric potential. Thus, both the first semiconductor layer 311 and the second semiconductor layer 321 are of P-channel type.

As illustrated in FIGS. 10 and 11B, the pair of the first source electrode 310S and the first drain electrode 310D in the first thin film transistor 310 is formed above the first semiconductor layer 311 overlapping the first semiconductor layer 311 and opposite to each other. The first source electrode 310S and the first drain electrode 310D are formed in the second metal layer ML2 in the TFT layer L1 illustrated in FIG. 4A.

Note that, the term "overlapping" in this specification refers to a positional relationship overlapping each other when viewed in the vertical direction.

Furthermore, as illustrated in FIGS. 10 and 11B, the first drain electrode 310D is formed to overlap the second gate electrode 320G of the second thin film transistor 320. The first drain electrode 310D and the second gate electrode 320G are electrically connected by a fourth contact portion 114 (fourth conductive portion). The fourth contact portion 114 is formed by burying conductive material in the fourth contact hole formed in a thickness direction at a position where the first drain electrode 310D and the second gate electrode 320G overlap. In this embodiment, as illustrated in FIG. 11B, the fourth contact portion 114 is formed by burying part of the first drain electrode 310D in the fourth contact hole formed penetrating the gate insulating film 330.

Note that, as illustrated in FIG. 11B, the fourth contact hole corresponding to the fourth contact portion 114 is formed in the gate insulating film 330. In this embodiment, three fourth contact portions 114 are formed as illustrated in FIG. 10.

As illustrated in FIGS. 10 and 11B, the pair of the second source electrode 320S and the second drain electrode 320D in the second thin film transistor are formed above the second semiconductor layer 321 overlapping the second semiconductor layer 321 and opposite to each other. The first source electrode 310S and the first drain electrode 310D are formed in the second metal layer ML2 in the TFT layer L1.

Furthermore, as illustrated in FIGS. 10 and 12B, the second drain electrode 320D extends linearly along the column direction (vertical direction), and an island-shaped electrode portion 120 wider than the extended portion is formed on a side opposite to the second semiconductor layer 321.

The electrode portion 120 is electrically connected to the lower electrodes 12 of the organic EL device 10 through the third contact portion 113 (third conductive portion) and a relay electrode in the same layer as the gate line 21. The third contact portion 113 is formed by burying conductive material to the third contact hole formed through the first interlayer insulating film 340 and the second interlayer insulating film 350 formed in the upper layer of the electrode portion 120.

The source line 22 is linearly formed along the column direction of the pixels 100 (vertical direction), as illustrated in FIGS. 10, 11A, 11B, and 12B. The source line 22 is arranged to pass near the first thin film transistor 310, and is electrically connected to the first source electrode 310S.

In this embodiment, the source line 22 and the first semiconductor layer 311 are overlapped with each other such that part of the linear source line 22 serves as the first source electrode 310S. In this embodiment, the source lines 22 are formed in the TFT layer L1 illustrated in FIGS. 4A and 4B, and are formed in the second metal layer ML2.

Note that, the source line 22 is formed on the gate insulating film 330 except of for the portion overlapping with the first thin film transistor 310. In addition, the source line 22 is formed to three-dimensionally cross the gate line 21, the second power supply line 23B, and the auxiliary line 25 to be described later, through the first interlayer insulating film 340.

The first power supply line 23A is linearly formed along the column direction (vertical direction) of the pixels 100 in the same manner as the source line 22. The first power supply line 23A is arranged to pass through the proximity of the second thin film transistor 320, and is electrically connected to the second source electrode 320S.

In this embodiment, the first power supply line 23A and the second semiconductor layer 321 overlap each other such that part of the linear first power supply line 23A serves as the second source electrode 320S. The first power supply line 23A has a positive electric potential, and the power is supplied to the second source electrode 320S in the second thin film transistor 320. In this embodiment, the first power supply line 23A is formed in the second metal layer ML2 in the TFT layer L1 in FIG. 4A.

Note that, the first power supply line 23A is formed on the gate insulating film 330 except the portion overlapping the second thin film transistor 320. In addition, the first power supply line 23A is formed to three-dimensionally crosses the gate line 21 and the second power supply line 23B to be described later through the first interlayer insulating film 340.

The source line 22 and the first power supply line 23A with the configuration described above are arranged in parallel with each other. Furthermore, as described above, the source line 22 and the first power supply line 23A are formed in the second metal layer ML2 in which the pair of the first source electrode 310S and the first drain electrode 310D, and the pair of the second source electrode 320S and the second drain electrode 320D, and are also formed by pattering the same metal film.

As illustrated in FIGS. 11A and 11B, the first interlayer insulating film 340 is formed to cover the first thin film transistor 310, the second thin film transistor 320, the source line 22, and the first power supply line 23A. The first interlayer insulating film 340 is the uppermost layer of the TFT layer L1, and is formed to cover the entire electrodes and lines formed underneath.

The gate line 21 is linearly formed along the row direction (horizontal direction) of the pixels 100, as illustrated in FIG. 9. Furthermore, the gate line 21 is formed on the first interlayer insulating film 340 as illustrated in FIG. 11A, and is formed in the third metal layer ML3 in the line layer L2 illustrated in FIG. 4A. More specifically, the gate lines 21 are formed in a layer different from the layer in which the first gate electrodes 310G and others are formed (the first metal layer ML1) and different from the layer in which the first power supply line 23A and the source line 22 are formed (the second metal layer ML2).

Furthermore, the gate line 21 is arranged to pass through the proximity of the first thin film transistor 310, and is electrically connected to the first gate electrode 310G. In this embodiment, as illustrated in FIGS. 10 and 11A, the gate line 21 and the first gate electrode 310G are arranged to three-dimensionally cross each other, and at the intersection (overlapping portion), the gate line 21 and the first gate electrode 310G are electrically connected through the first contact portion 111 (first conductive portion).

The first contact portion 111 is formed by burying conductive material to the contact hole formed in the thickness direction in a position where the gate line 21 and the first gate electrode 310G overlap each other. In this embodiment, the first contact portion 111 is formed by burying part of the gate line 21 in the first contact hole through the first interlayer insulating film 34 and the gate insulating film 330 as illustrated in FIG. 11A.

The second power supply line 23B is linearly formed along the column direction (horizontal direction) of the pixels 100. In addition, as illustrated in FIG. 11B, the second power supply line 23B is formed on the first interlayer insulating film 340, and is formed in the third metal layer ML3 in the line layer L2 illustrated in FIG. 4A. More specifically, the second power supply line 23B is formed in the same layer as the gate line 21 as illustrated in FIG. 12A.

Furthermore, the second power supply line 23B is arranged between the gate line 21 and the auxiliary line 25 side-by-side with the gate line 21 and the auxiliary line 25. Furthermore, the second power supply line 23B is arranged to three-dimensionally cross the first power supply line 23A, and at the intersection (overlapping portion), the second power supply line 23B and the first power supply line 23A are electrically connected through the second contact portion 112 (second conductive portion) formed in the thickness direction. Accordingly, in this embodiment, the electric potential of the second power supply line 23B is positive electric potential, which is the same as the first power supply line 23A.

The second contact portion 112 is formed by burying conductive material on the second contact hole formed through the first interlayer insulating film 340 as illustrated in FIG. 11B. In this embodiment, the second contact portion 112 is formed by burying part of the second power supply line 23B on the second contact hole. Furthermore, in this embodiment, 16 second contact portions 112 (8 rows and 2 columns) are formed as illustrated in FIGS. 9 and 10.

Note that, in this embodiment, the material composing the second power supply line 23B is composed of one device selected from Al (aluminum), Cu (copper), Ag (silver). Furthermore, the second power supply line 23B may be multi-layered, and the main line composing the second power supply line 23B may be made of one device selected among Al, Cu, and Ag.

The auxiliary line 25 is linearly formed along the row direction (horizontal direction) of the pixels 100, as illustrated in FIG. 9. Furthermore, as illustrated in FIG. 11C, the auxiliary line 25 is formed on the first interlayer insulating film 340, and is formed in the third metal layer ML3 in the line layer L2 illustrated in FIG. 4B. More specifically, the auxiliary line 25 is formed in the same layer as the gate line 21 and the second power supply line 23B as illustrated in FIG. 12A.

In addition, the auxiliary line 25 is arranged side-by-side with the second power supply line 23B as illustrated in FIG. 9. Furthermore, the auxiliary line 25 is arranged to three-dimensionally cross the first power supply line 23A, and is electrically connected to the upper electrode 14 formed above the auxiliary line 25 as illustrated in FIG. 11C, through the fifth contact portion 115 (fifth conductive portion) formed on the three-dimensional crossing (overlapping portion). Thus, in this embodiment, the electric potential of the auxiliary line 25 is same as the upper electrode 14.

As illustrated in FIG. 11C, the fifth contact portion 115 is formed by burying the conductive material on the fifth contact hole through the second interlayer insulating film 350 on the auxiliary line 25. In this embodiment, the fifth contact portion 115 is formed by burying part of the upper electrode 14 on the fifth contact hole. Furthermore, in this embodiment, 16 fifth contact portions 115 (8 rows and 2 columns) are formed as illustrated in FIGS. 8 to 10.

As illustrated in FIG. 11C, the organic EL device 10 is formed on the second interlayer insulating film 350. In this embodiment, the lower electrodes 12 of the organic EL device 10 are formed on the second interlayer insulating film 350. As illustrated in FIG. 8, each of the lower electrodes 12 is formed for a pixel 100, and is patterned excluding the portion in which the fifth contact portion 115 is formed. Note that, the organic light emitting layer 13 and the upper electrode 14 are sequentially formed on the lower electrodes 12.

As described above, in the EL display panel 1 according to the first embodiment, the gate line 21, the second power supply line 23B and the auxiliary line 25 are arranged to orthogonally and three-dimensionally cross the source line 22 and the first power supply line 23A. In addition, the gate line 21, the second power supply line 23B and the auxiliary line 25 is formed in the third metal layer ML3 in the line layer L2 on the first interlayer insulating film 340, and is formed in a layer different from the first gate electrode 310G and the second gate electrode 320G formed in the first metal layer ML1 in the TFT layer L1. Furthermore, the gate line 21, the second power supply line 23B and the auxiliary line 24 are formed in a layer different from the second metal layer ML2 in the TFT layer L1 in which the source line 22 and the first power supply line 23A are formed, and different from the organic EL layer L1 as well.

Next, the method of manufacturing the EL display panel 1 according to the first embodiment of the present invention shall be described with reference to FIGS. 13A to 13J. FIGS. 13A to 13J are cross-sectional views schematically illustrating each process of the method of manufacturing the EL display device according to the first embodiment of the present invention. Note that, FIGS. 13A to 13J corresponds to the cross section along X2-X2' in FIG. 9.

Figure 13A:
FIG. 13A is a cross-sectional view schematically illustrating a substrate preparation process in the method of manufacturing the EL display panel according to the first embodiment of the present invention.

First, the substrate 300 is prepared as illustrated in FIG. 13A. An insulating substrate made of glass material such as quartz glass can be used for the substrate 300. Note that, an undercoating layer such as silicon oxide film or silicon nitride film may be formed on an upper surface of the substrate 300 to prevent dispersion of impurity from the substrate 300. The thickness of the undercoating film is approximately 100 nm.

Figure 13B:
FIG. 13B is a cross-sectional view schematically illustrating a first metal layer (gate electrode) forming process in the method of manufacturing the EL display panel according to the first embodiment of the present invention.

Next, after washing the substrate with purified water and others, forming heat-resistant first metal film above an entire surface of the substrate 300 by sputtering, for example, and pattering the first metal film to a predetermined shape by photolithography, wet etching and others to form the first gate electrode 310G and the second gate electrode 320G as illustrated in FIG. 13B. Any of heat resistant metal such as Mo, W, Ta, Ti, and Ni or their alloy may be used as the material for the first metal film. In this embodiment, the first metal film made of Mo with the thickness of approximately 100 nm is formed.

Figure 13C:
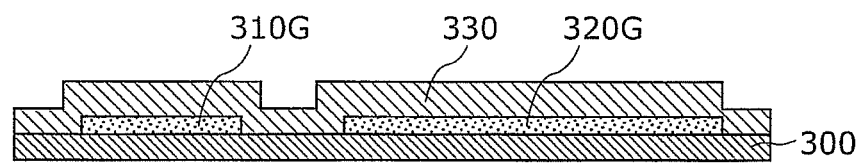
FIG. 13C is a cross-sectional view schematically illustrating the gate insulating film forming process in the method of manufacturing the EL display panel according to the first embodiment of the present invention.

Next, as illustrated in FIG. 13C, the gate insulating film 330 is formed on the entire surface of the substrate 300 to cover the first gate electrode 310G and the second gate electrode 320G. Silicon oxide film ($SiO_2$), silicon nitride film (SiN), or a composite film of them may be used as the material for the gate insulating film 330. In this embodiment, the thickness of the gate insulating film 330 is approximately 200 nm.

Figure 13D:
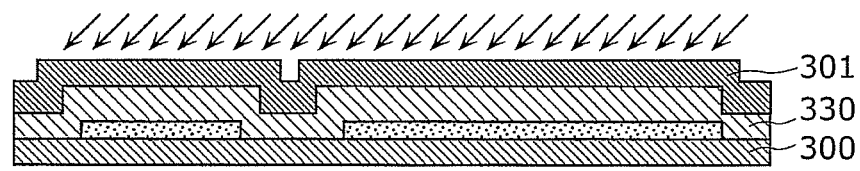
FIG. 13D is a cross-sectional view schematically illustrating a non-crystalline semiconductor film forming process and a crystalline semiconductor film forming process (laser radiation process) in the method of manufacturing the EL display panel according to the first embodiment of the present invention.

Subsequently, as illustrated in FIG. 13D, non-crystalline semiconductor film 301 is formed on the gate insulating film 330. In this embodiment, an amorphous silicon film is used as the non-crystalline semiconductor film 301, and the non-crystalline semiconductor film 301 is formed with a thickness of approximately 50 nm by plasma CVD. Note that, the gate insulating film 330 and the non-crystalline semiconductor film 301 are formed by continuous plasma CVD while maintaining a vacuum state.

Subsequently, as shown in the arrows in FIG. 13D, a polysilicon semiconductor film is obtained by irradiating laser such as excimer laser to crystallize the non-crystalline semiconductor film 301 to polysilicon semiconductor film. More specifically, by irradiating excimer laser and others on the amorphous silicon film to raise the temperature of the amorphous silicon film to a predetermined temperature range to crystallize the amorphous silicon film, and to increase the grain size to form the polysilicon semiconductor film, for example. Here, the predetermined temperature range is, for example, from 1100 to 1414 degrees Celsius. Furthermore, an average grain size of the polysilicon semiconductor is 20 nm to 60 nm.

Here, the first gate electrode 310G and the second gate electrode 320G are exposed to high temperature in the laser irradiating process. For this reason, it is preferable to form the first gate electrode 310G and the second gate electrode 320G with a metal having a melting point higher than the upper limit (1414 degrees Celsius) of the temperature range. On the other hand, lines and electrodes formed in the second metal layer ML2 and the third metal layer ML3 may be formed with the metal having a melting point lower than the lower limit of the temperature range (1100 degrees Celsius).

Note that, it is preferable to perform annealing at 400 to 500 degrees Celsius for 30 minutes as a pretreatment before irradiating laser. Furthermore, after irradiating laser, hydrogen plasma treatment in vacuum for a few seconds to a few dozens seconds is preferred.

Figure 13E:
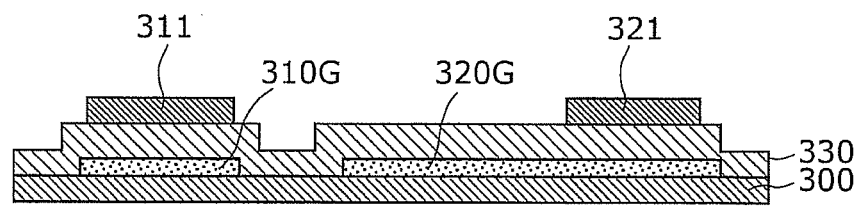
FIG. 13E is a cross-sectional view schematically illustrating a semiconductor layer forming process (an island growing process) in the method of manufacturing the EL display panel according to the first embodiment of the present invention.

After that, as illustrated in FIG. 13E, the crystallized non-crystalline semiconductor film 301 is patterned in an island shape to form the first semiconductor layer 311 and the second semiconductor layer 321.

Figure 13F:
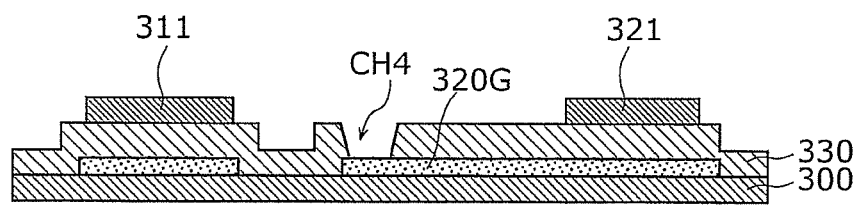
FIG. 13F is a cross-sectional view schematically illustrating the fourth contact hole in a method of manufacturing the EL display panel according to the first embodiment of the present invention.

Next, as illustrated in FIG. 13F, the fourth contact hole CH4 through the gate insulating film 330 is formed by photolithography, wet etching, and others, to electrically connect the first drain electrode 310D and the second gate electrode 320G.

Figure 13G:
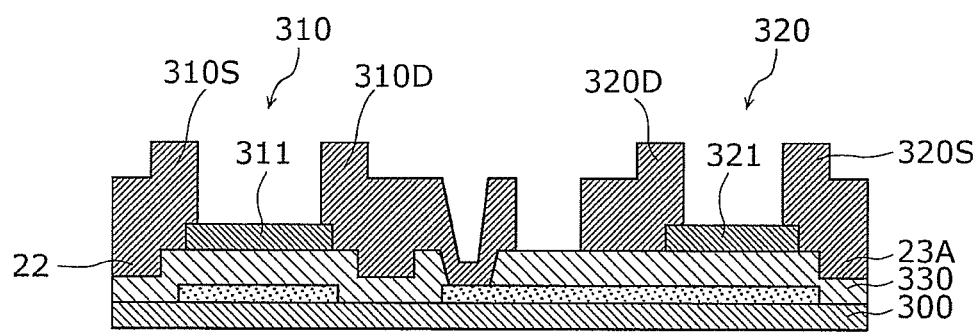
FIG. 13G is a cross-sectional view schematically illustrating a second metal layer forming process in the method of manufacturing the EL display panel according to the first embodiment of the present invention.

Subsequently, as illustrated in FIG. 13G, the second metal film (not illustrated) is formed by sputtering and others to cover the gate insulating film 330, the first semiconductor layer 311 and the second semiconductor layer 321 and patterning the second metal film by photolithography and wet etching to form the source line 22, the first power supply line 23A, the first source electrode 310S and the first drain electrode 310D, the second source electrode 320S, and the second drain electrode 320D in a predetermined shape. Here, the fourth contact hole CH4 is filled with the material composing the second metal film, forming the fourth contact portion 114.

Note that, the material composing the second metal film which includes the source line 22, the first power supply line 23A, the first source electrode 310S, the first drain electrode 310D, the second source electrode 320S, and the second drain electrode 320D is preferably made of metal with low resistivity. Metal such as one of Al, Cu, and Ag, or alloys of these metals can be used as the material for the second metal film. In this embodiment, the second metal film made of Al with the thickness of approximately 300 nm is formed. In addition, it is preferable to form highly heat-resistant metal such as Mo is formed as a barrier metal on an upper side, lower side, or both of Al. The thickness of the barrier metal is approximately 50 nm. Furthermore, in a case where it is necessary to further lower the resistance of lines, it is preferable to use Cu instead of Al. Alternatively, increasing the thickness of the second metal film can lower the resistance, instead of changing the material.

Furthermore, it is preferable to form a low-resistance semiconductor film between the first source electrode 310S and the first semiconductor layer 311, and between the first drain electrode 310D and the first semiconductor layer 311. An amorphous silicon film in which n-type dopant such as Phosphorus is doped as impurity, or an amorphous silicon film in which p-type dopant such as Boron is doped as impurity is used for the low-resistance semiconductor film. The thickness of the low resistance semiconductor film is approximately 20 nm. Furthermore, an undoped (impurity is not intentionally doped) amorphous silicon semiconductor film may be formed between the crystallized first semiconductor layer 311 and the low resistance semiconductor film (the amorphous silicon film in which impurity is doped) may be formed. Forming these films allows the desired TFT characteristics such as improvement in TFT characteristics. Note that the same applies to the second thin film transistor 320.

Figure 13H:
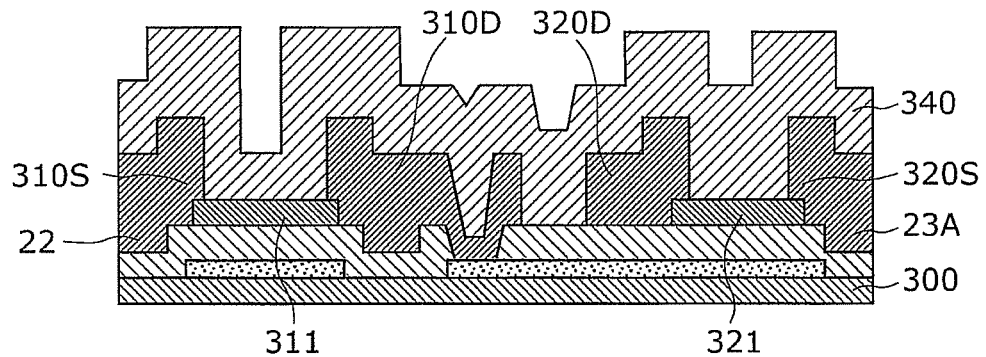
FIG. 13H is a cross-sectional view schematically illustrating a first interlayer insulating film forming process in the method of manufacturing the EL display panel according to the first embodiment of the present invention.

Next, as illustrated in FIG. 13H, the first interlayer insulating film 340 is formed above the entire surface of the substrate 300 by plasma CVD to cover exposed electrodes and lines such as the first source electrode 310S, the first drain electrode 310D, the second source electrode 320S and the second drain electrode 320D. The first interlayer insulating film 340 may be formed with a silicon oxide film, a silicon nitride film, or a laminated film of these films.

Figure 13I:
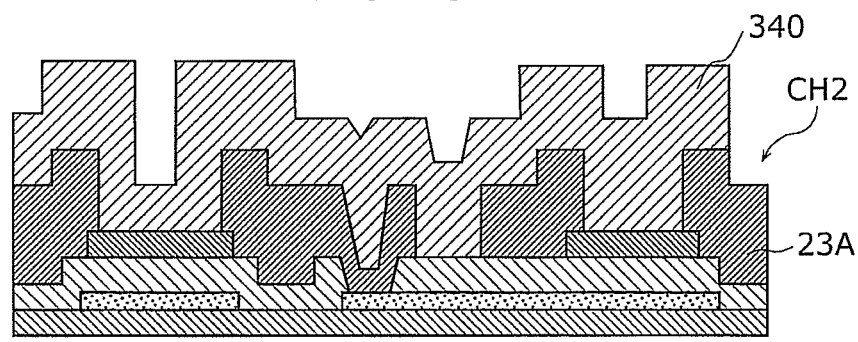
FIG. 13I is a cross-sectional view schematically illustrating a second contact hole forming process in the method of manufacturing the EL display panel according to the first embodiment of the present invention.

Subsequently, as illustrated in FIG. 13I, the second contact hole CH2 through the first interlayer insulating film 340 to connect the first power supply line 23A and the second power supply line 23B by photolithography, etching, and others. Here, though not illustrated, the first contact hole continuously passes through the first interlayer insulating film 340 and the gate insulating film 330 to connect the first gate electrode 310G and the gate line 21.

Figure 13J:
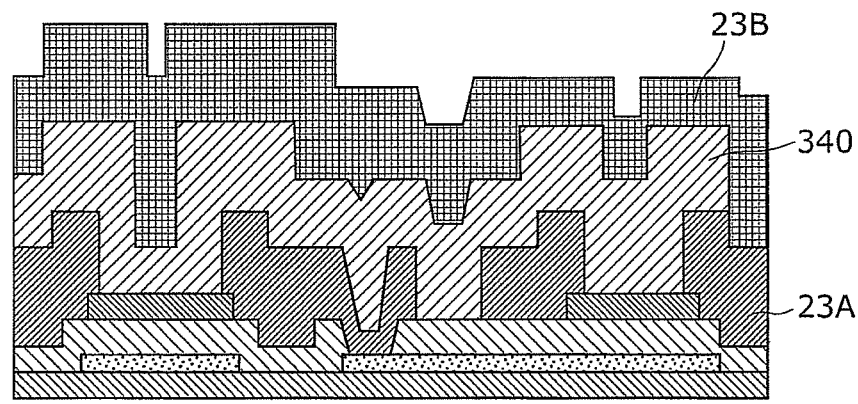
FIG. 13J is a cross-sectional view schematically illustrating a third metal layer process in the method of manufacturing the EL display panel according to the first embodiment of the present invention.

Next, as illustrated in FIG. 13J, the third metal film is formed on the first interlayer insulating film 340 by sputtering and others, and the gate line 21, the second power supply line 23B and the auxiliary line 25 are formed by patterning the third metal film into a predetermined shape by photolithography and etching, for example. Here, the second contact hole CH2 and the first contact hole (not illustrated) are filled with the material composing the third metal film, forming the second contact portion 112 and the first contact portion 111.

Note that, the material of the third metal film composing the gate line 21, the second power supply line 23B, and the auxiliary line 25 is preferably low resistance, and can be made of the metal same as the second metal film. For example, the third metal film can be formed by forming 300 nm of Al after forming 50 nm of Mo as a barrier metal.

Though not illustrated, the second interlayer insulating film 350 is formed by plasma CVD and others. The second interlayer insulating film 350 may be formed of the material same as the first interlayer insulating film 340. For example, a silicon oxide film, a silicon nitride film, or a laminated film of these films may be used.

Subsequently, the lower electrodes 12, the organic light emitting layer 13, and the upper electrode 14 are sequentially formed above the second interlayer insulating film 350. Note that, during the process, the fifth contact hold is formed in the second interlayer insulating film 350 to expose the auxiliary line 25 to electrically connect the auxiliary line 25 and the upper electrode 14 via the fifth contact hole.

As such, the EL display panel 1 according to the first embodiment of the present invention is manufactured.

As described above, in the EL display panel 1 according to the first embodiment of the present invention, the gate line 21 is formed in the TFT layer L2 on the first interlayer insulating film 340, and is arranged in a separate layer, that is, different from the layer in which the first gate electrode 310G (and the second gate electrode 320G). With this, material suitable for the gate line 21 and the first gate electrode 310G (and the second gate electrode 320G) can be selected separately.

Furthermore, in the EL display panel 1 according to the first embodiment, the gate line 21 is arranged above the first interlayer insulating film 340. Meanwhile, the first power supply line 23A (or the source line 22) is arranged lower than the first interlayer insulating film 340 and in the second metal layer ML2 (TFT layer L1) in the same layer as the first drain electrode 310D and the second source electrode 320S. With this, the interval between the gate line 21 and the first power supply line 23A (or the source line 22) is not dependent on the interval between the first gate electrode 310G (or the second gate electrode 320G) and the first drain electrode 310D (or the second source electrode 320S), and corresponds to the thickness of the first interlayer insulating film 340 formed on the first drain electrode 310D (or the second source electrode 320S).

Here, the first interlayer insulating film 340 formed on the first drain electrode 310D (or the second source electrode 320S) is for protecting the surface of the thin film semiconductor unit (the thin film semiconductor device for display apparatus). Thus, even when the thickness of the first interlayer insulating film 340 is increased, it does not affect the capability of the thin film semiconductor portion. Accordingly, the interval between the gate line 21 and the first drain electrode 310D (or the second source electrode 320S) can be increased by increasing the thickness of the first interlayer insulating film 340. With this, the distance between the gate line 21 and the first power supply line 23A (or the source line 22) can be secured. Thus, parasitic capacitance between the gate line 21 and the first power supply line 23A (and the source line 22) can be reduced.

Furthermore, in the EL display panel 1 according to the first embodiment, the first power supply line 23A electrically connected to the second source electrode 320S and the second power supply line 23B are arranged to three-dimensionally cross each other, and the first power supply line 23A and the second power supply line 23B are electrically connected by the second contact portion 112. With this, the second source electrode 320S in the second thin film transistor 320 can receive power supply in two directions; from the first power supply line 23A in vertical direction and from the second power supply line 23B in horizontal direction. Therefore, with respect to the IR drop generated along the increase in screen size of the display apparatus in the central region of the display area, it is possible to reduce the IR drop amount. As a result, it is possible to reduce the unevenness in brightness of the display apparatus. Particularly, the organic EL display panel is a current-driven display panel. Thus, it is preferable to lower the line resistance and reduce the IR drop to suppress the uneven brightness.

In addition, in the EL display panel 1 according to the first embodiment, the second power supply line 23B and the auxiliary line 25 are formed in the same layer as the gate line 21 on the first interlayer insulating film 340, and arranged side-by-side with the gate line 21. With this, it is possible to fill the depressed portion of the unevenness formed by arranging the gate line 21 on the first interlayer insulating film 340 with the second power supply line 23B and the auxiliary line 25.

More specifically, the second power supply line 23B and the auxiliary line 25 can reduce the unevenness on the first interlayer insulating film 340, improving the flatness of the thin film semiconductor unit. As a result, it is possible to reduce the effect of the unevenness on the first interlayer insulating film 340 to the upper layer. Accordingly, flatness of the organic EL device 10 formed on the thin film semiconductor unit can be improved, thereby suppressing the unevenness in the brightness of the EL display panel. Furthermore, in this case, it is not necessary to increase the thickness of the planarizing film such as the second interlayer insulating film formed under the organic EL device 10. Thus, it is possible to achieve a thinner EL display panel.

Furthermore, in the EL display panel 1 according to the first embodiment, it is possible to provide power to the second thin film transistor 320 in one of the pixels from two directions; that is, from the first power supply line 23A in column direction and the second power supply line 23B in row direction. With this, for example, even where there is a disconnection in the first power supply line 23A connected to the second thin film transistor 320 in a certain pixel, it is possible to supply power to the second thin film transistor 320 in the pixel by the second power supply line 23B, the other power supply line. More specifically, the power can be supplied to one pixel from two power supply lines. Accordingly, it is possible to suppress the defect in pixels, thereby suppressing unevenness in the display on the EL display panel.

As such, in this embodiment, the second power supply line 23B serves as a backup line for power supply, and also serves as a planarizing film.

Furthermore, in the EL display panel 1 according to the first embodiment, the auxiliary lines 25 (EL power supply line) for preventing the voltage drop in the central region of the display screen along with the increase in the size of the screen of the EL display panel are arranged in the line layer L2, that is, in the thin film semiconductor unit instead of the EL unit (organic EL layer L3). In addition, the auxiliary line 25 is arranged side-by-side with the gate line 21 and the second power supply line 23B on the upper surface of the first interlayer insulating film 340. With this, it is possible to effectively use the existing layer used for arranging the gate line 21 and the second power supply line 23B to arrange the auxiliary line 25. As such, by moving the auxiliary line 25 arranged in the EL unit to the existing layer in the thin film semiconductor unit, it is possible to open up the space conventionally used for arranging the auxiliary line in the EL unit without narrowing the thin film semiconductor unit. Therefore, it is possible to increase the flexibility in design of the EL unit, and increase the aperture ratio of each pixel.

As such, in the EL display panel 1 according to the first embodiment, when capacitance for unit area formed by the gate line 21, the first power supply line 23A, and the first interlayer insulating film 340 interposed by the gate line 21 and the first power supply line 23A is $C_{PAS}$, and capacitance per unit area formed by the first gate electrode 310G, the first power supply line 23A, and the gate insulating film 330 interposed by the first gate electrode 310G and the first power supply line 23A is $C_{GI}$, $C_{PAS} < C_{GI}$ is preferable.

Furthermore, it is preferable that the capacitance $C_{PAS}$ per unit area formed by the first interlayer insulating film 340 interposed by the third metal layer ML3 in which the gate line 21 is formed and the second metal layer ML2 in which the first power supply line 23A is formed is smaller than the capacitance $C_{GI}$ formed by the gate insulating film 330 interposed by the first metal layer ML1 in which the first gate electrode 310G is formed and the second metal layer ML2 in which the first power supply line 23A is formed.

With this, when it is assumed that the thickness of the first interlayer insulating film 340 is $d_{PAS}$ and the thickness of the gate insulating film 330 is $d_{GI}$, $d_{PAS} > d_{GI}$ is satisfied when the first interlayer insulating film 340 and the gate insulating film 330 are made of the same material. With this, it is possible to separate the interval between the gate line 21 on the first interlayer insulating film 340 and the first power supply line 23A under the first interlayer insulating film 340 more than the thickness of the gate insulating film 330. Thus, it is possible to further reduce the parasitic capacitance between the gate line 21 and the first power supply line 23A. Furthermore, in the same manner, the interval between the gate line 21 and the source line 22 can also be separated more than the thickness of the gate insulating film 330. Thus, it is possible to further reduce the parasitic capacitance between the gate line 21 and the source line 22.

More specifically, it is preferable that the capacitance $C_{PAS}$ formed by the first interlayer insulating film 340 is smaller than $1.5 \times 10^{-4}$ F/m$^2$). Furthermore, it is preferable that the capacitance $C_{GI}$ formed by the gate insulating film 330 is $1.5 \times 10^{-4}$ F/m$^2$) or more.

In addition, in the EL display panel 1 according to the first embodiment, the second power supply line 23B is formed to cover the first semiconductor layer 311 and the second semiconductor layer 321 as illustrated in FIG. 9. Thus, it is preferable to compose both the first semiconductor layer 311 and the second semiconductor layer 321 to be P-channel type.

In the semiconductor layer (channel region) of the thin film transistor, lattice defect may occur at the time of manufacturing on the surface of the semiconductor layer and on the surface of the interlayer insulating film covering the thin film transistor. When the lattice defect occurs, there is an unstable interface state, causing the electric potential of the back channel of the semiconductor layer to be unstable.

Figure 14:
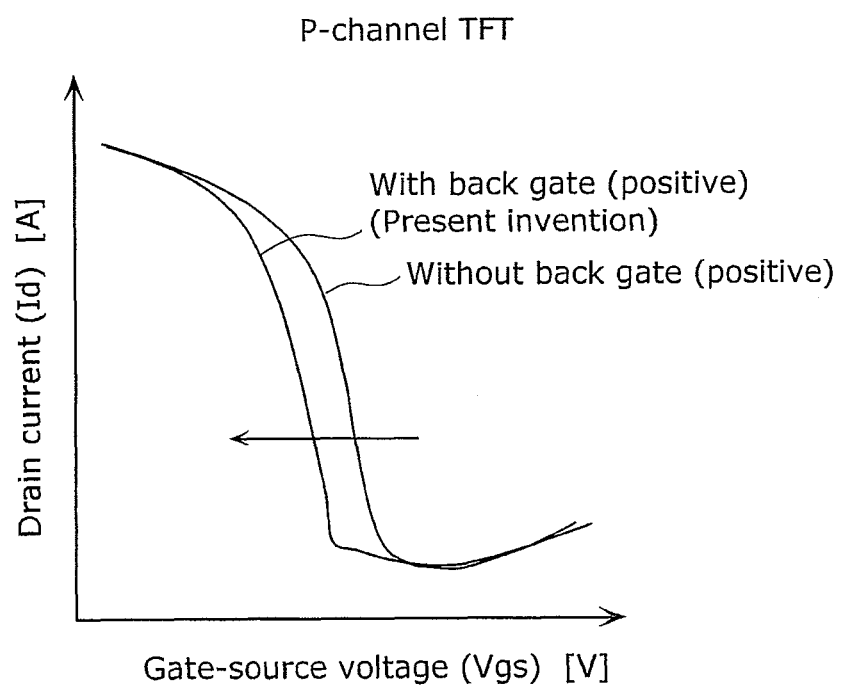
FIG. 14 is a diagram for illustrating the TFT characteristics of the thin film transistor in the EL display panel according to the first embodiment of the present invention.

In the first embodiment, the P-channel first semiconductor layer 311 and the second semiconductor layer 321 are formed to overlap the second power supply line 23B having the positive electric potential, forming a P-channel TFT with a back gate. With this, it is possible to stabilize the electric potential in the back channel. As a result, as illustrated in FIG. 14, the first thin film transistor 310 and the second thin film transistor 320 which are P-channel TFT with the back gate can achieve the effect in suppressing the off-leakage current and reducing the effect of external noise, comparable to the P-channel TFT without a back gate. This is because the back gate covers the upper side of the channel region, and serves as a shield for the electromagnetic wave to the external noise. Therefore, it is possible to implement an EL display panel including the thin film transistor with good off characteristics and highly resistant to external noise.

Note that, the effects can be achieved as long as at least part of the second power supply line 23B overlaps the first semiconductor layer 311 and the second semiconductor layer 321. However, it is preferable that the second power supply line 23B and the first semiconductor layer 311 or the second semiconductor layer 321 completely overlap.

In addition, in the EL display panel 1 according to the first embodiment, the second power supply line 23B and the auxiliary line 25 are formed with the thickness substantially identical to the gate line 21, that is, at a level same as or close to the gate line 21, and it is preferable to form the second power supply line 23B and the auxiliary line 25 to have a width, in combination, corresponding to the width between the two adjacent gate lines 21. Furthermore, it is preferable that the distance from the second power supply line 23B or the auxiliary line 25 to the two adjacent gate lines 21 is 4 μm or more. In addition, it is preferable that the distance between the second power supply line 23B and the auxiliary line 25 is 4 μm or more.

In this embodiment, the gate line 21 is formed on the first interlayer insulating film 340. Thus, without any adjustment, the region in which the gate line 21 is formed protrudes from the region in which the gate line 21 is not formed as much as the thickness of the gate line 21, forming a depressed portion between adjacent gate lines 21.

In response to this problem, by arranging the second power supply line 23B and the auxiliary line 25 at a substantially same level as the gate line 21, and the second power supply line 23B and the auxiliary line 25 to have the width corresponding to the interval between the two adjacent gate lines 21, it is possible to ensure flatness by the second power supply line 23B and the auxiliary line 25. With this, it is possible to improve the flatness of the organic EL device formed thereon, thereby suppressing the unevenness in luminescence in the EL display panel.

In addition, in the EL display panel 1 according to this embodiment, the second power supply line 23B and the auxiliary line 25 are preferably formed at a level substantially equal to the gate line 21 and next to the two adjacent gate lines 21 to fill the interval between the two adjacent gate lines 21. Furthermore, the second power supply line 23B and the auxiliary line 25 are preferably arranged to fill the interval and to be close to each other.

With this, the depressed portion between the adjacent gate lines 21 is buried by the second power supply line 23B, thereby securing flatness.

In addition, in the EL display panel according to the first embodiment, the second power supply line 23B is preferably formed at a level substantially equal to the gate line 21, and has a width wider than the width of the first power supply line 23A.

With this, it is possible to improve the flatness of the thin film semiconductor unit. In addition, it is possible to reduce the resistance of the second power supply line 23B to be lower than the first power supply line 23A. Thus, it is possible to significantly reduce the IR drop that occurs in the central region of the display region as the size of the screen increases.

In the EL display panel 1 according to the first embodiment, the second power supply line 23B and the auxiliary line 25 are preferably formed with the uniform thickness, and along the shape of the surface of the structure formed under the second power supply line 23B.

With this, the second power supply line 23B and the auxiliary line 25 can be flat-shaped line with the width wider than the width of the first power supply line 23A. Thus, it is possible to form the second power supply line 23B and the auxiliary line 25 as the low resistance line. Accordingly, the power can be supplied to the second source electrode 320S through the second power supply line 23B with lower line resistance and through the first power supply line 23A, thereby significantly reducing the IR drop amount.

Variation of the First Embodiment

Figure 15:
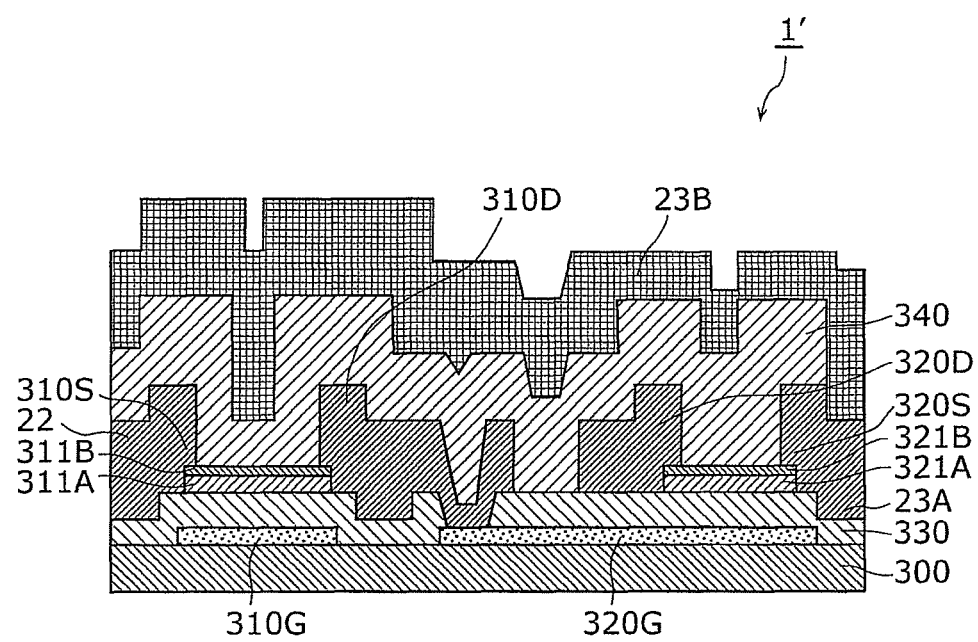
FIG. 15 is a cross-sectional view of the EL display panel according to a variation of the first embodiment of the present invention.

Next, the EL display panel 1' according to a variation of the first embodiment of the present invention shall be described with reference to FIG. 15. FIG. 15 is a cross-sectional view of the EL display panel 1' according to the variation of the first embodiment of the present invention. Note that, FIG. 15 corresponds to FIG. 11B, a cross sectional view of the EL display panel 1 according to the first embodiment of the present invention.

The EL display panel 1' according to this variation has the same basic configuration as the EL display panel 1 according to the first embodiment of the present invention. Accordingly, in FIG. 15, the same reference numerals are assigned to the components identical to the components illustrated in FIG. 11B and detailed description for these components are omitted or simplified. Furthermore, the configuration other than the illustration in FIG. 11B is identical to the first embodiment.

The configurations of the first semiconductor layer in the first thin film transistor 310 and the second semiconductor layer in the second thin film transistor 320 in the EL display panel 1' according to this variation are different from the EL display panel 1 according to the first embodiment of the present invention.

As illustrated in FIG. 15, in the EL display panel 1' according to this variation, the first semiconductor layer in the first thin film transistor 310 includes a first channel layer 311A composed of a polycrystalline semiconductor film and a second channel layer 311B composed of a non-crystalline semiconductor film. The second semiconductor layer in the second thin film transistor 320 also includes a first channel layer 321A composed of a polycrystalline semiconductor film and a second channel layer 321B composed of a non-crystalline semiconductor film.

The first channel layer 311A and the first channel layer 321A can be composed of a polycrystalline semiconductor film formed by crystallizing an amorphous silicon film.

The second channel layer 311B and the second channel layer 321B can be composed of an amorphous silicon film in the same manner as the first semiconductor layer 311 and the second semiconductor layer 321 illustrated in FIG. 11B.

The first channel layer 311A and the first channel layer 321A composed of the polycrystalline semiconductor film can be formed by crystallizing the amorphous silicon film through laser irradiation. In planar view, the first channel layer 311A (or the first channel layer 321A) and the second channel layer 311B (or the second channel layer 321B) have the same shape, and are formed in island-shape on the gate insulating film 330.

The EL display panel 1' according to this variation can achieve the same effects as the EL display panel 1 according to the first embodiment of the present invention.

Furthermore, in the EL display panel 1' according to this variation, the first semiconductor layer and the second semiconductor layer in thin film transistor are formed such that the first channel layer 311A composed of the polycrystalline semiconductor film (or the first channel layer 321A) is formed under the second channel layer 311B (or the second channel layer 321B) composed of the amorphous silicon film.

With this, in the first thin film transistor 310 and the second thin film transistor 320, it is possible to increase carrier mobility by the first channel layer 311A and the first channel layer 321A composed of the polycrystalline semiconductor film, thereby improving ON characteristics. In addition, the second channel layer 311B and the second channel layer 321B composed of the amorphous silicon film are formed on the semiconductor layer, thereby maintaining OFF characteristics.

Second Embodiment

Figure 16:
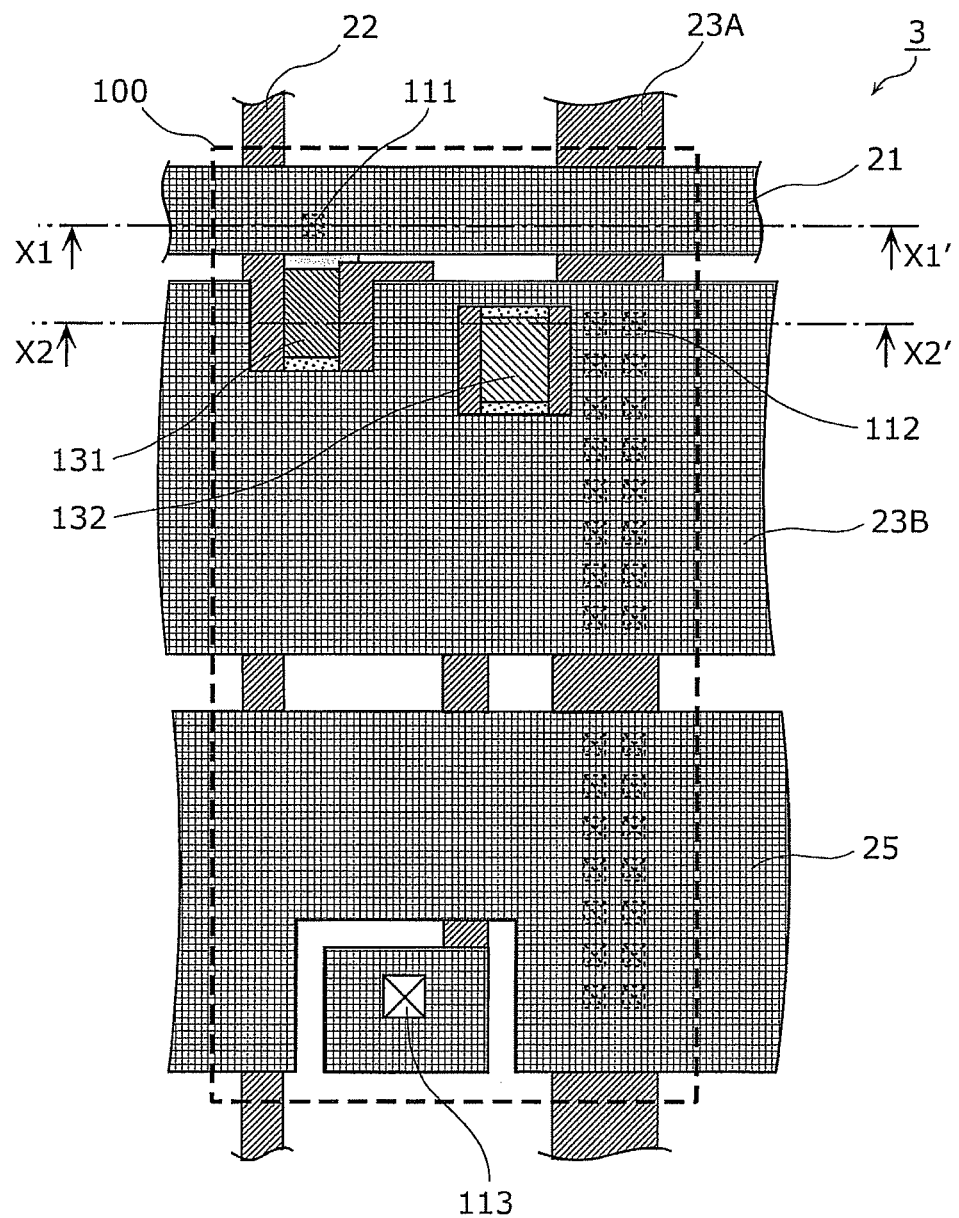
FIG. 16 is a planar view of the EL display panel (partially see-through) according to a second embodiment of the present invention.
Figure 17:
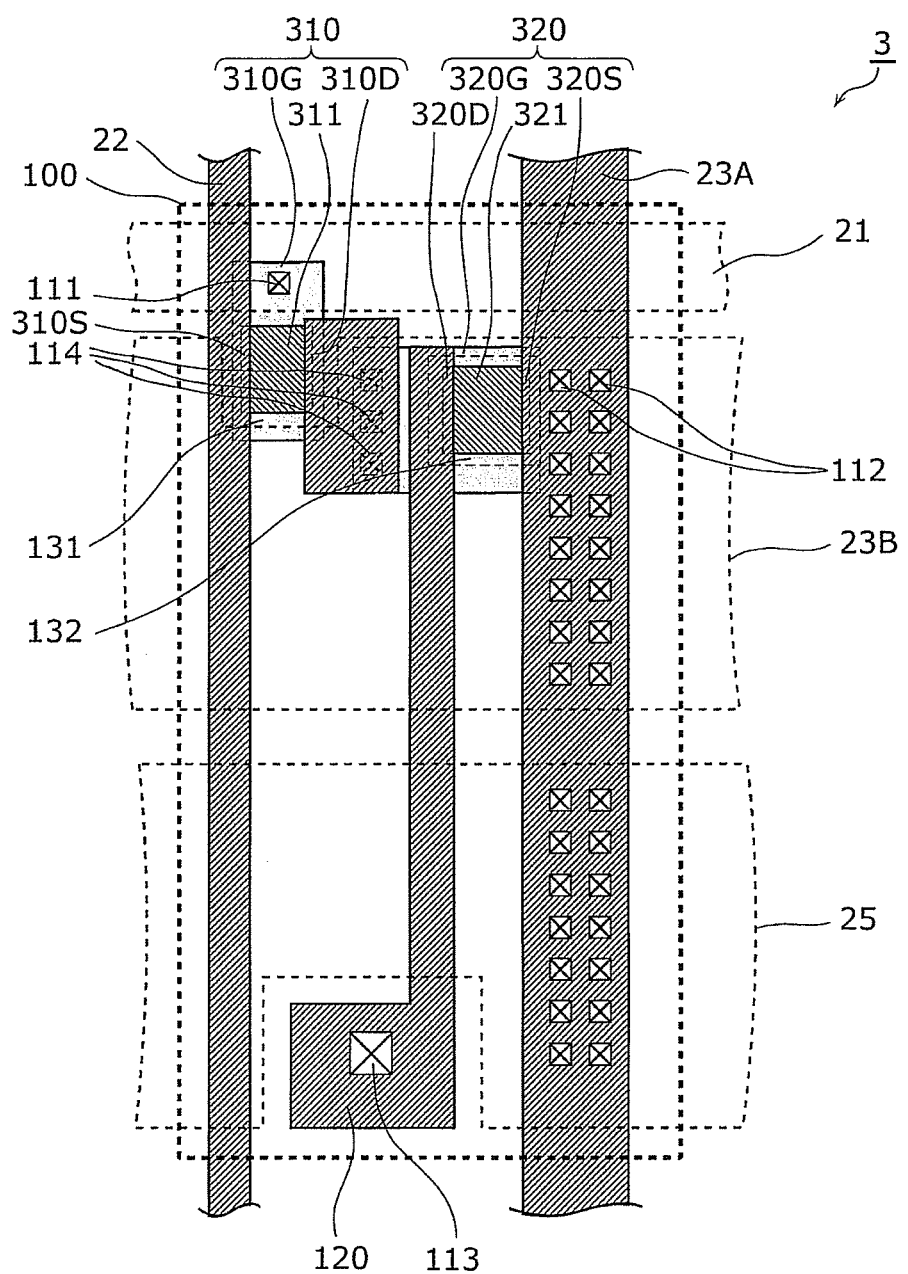
FIG. 17 is a planar view of the EL display panel (partially see-through) according to the second embodiment of the present invention.
Figure 18:
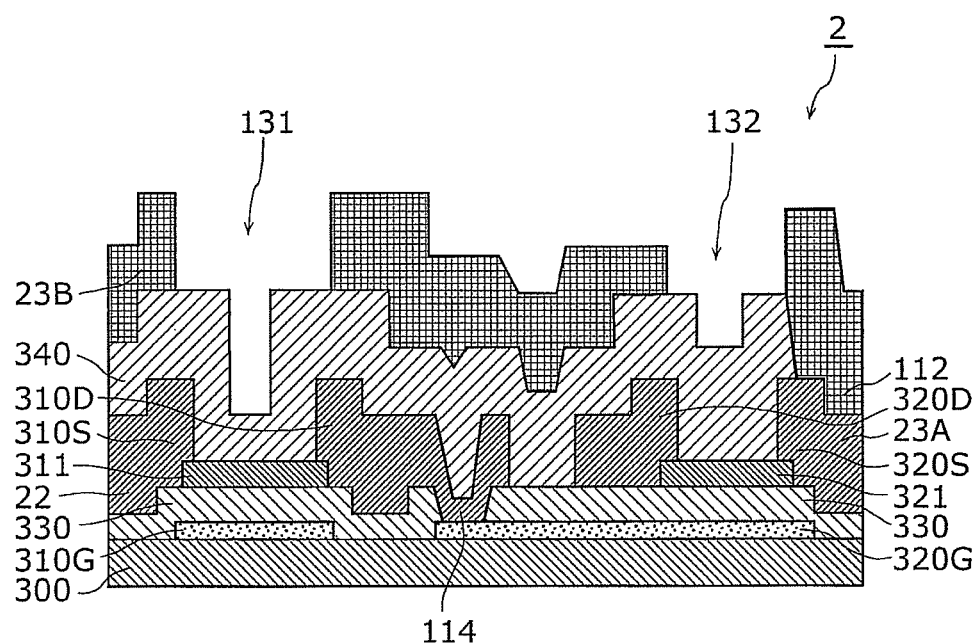
FIG. 18 is a cross-sectional view of the EL display panel according to the second embodiment of the present invention (along X2-X2' in FIG. 16)

Next, the EL display panel 2 according to the second embodiment of the present invention shall be described with reference FIGS. 16 to 18. FIG. 16 is a planar view of the EL display panel according to the second embodiment of the present invention with the organic EL layer L1 and the second interlayer insulating film transmitted. FIG. 17 is a planar view of the EL display panel according to the second embodiment of the present invention with the organic EL layer L1, the line layer L2 and the first interlayer insulating film transmitted. FIG. 18 is a cross sectional view along X2-X2' in FIG. 16. Note that, the cross sectional surface along X1-X1' in FIG. 16 is identical to FIG. 11A. Furthermore, in these diagrams, the configuration formed in the organic EL layer L3 is omitted.

The EL display panel 2 according to the second embodiment of the present invention has the same basic configuration as the EL display panel 1 according to the first embodiment of the present invention. Accordingly, in FIGS. 16 to 18, the same reference numerals are assigned to the components identical to those illustrated in FIGS. 8 to 10, and the detailed description for these components are omitted or simplified.

The EL display panel 2 according to the second embodiment is different from the EL display panel 1 according to the first embodiment of the present invention in that the channel type of the first semiconductor layer 311 and the second semiconductor layer 312 is N-channel type, and the source electrode and the drain electrode in the first embodiment are the drain electrode and the source electrode, respectively, in the second embodiment, and the configuration of the power supply line 23 is different. Note that the rest of the configuration is identical to the first embodiment.

As illustrated in FIGS. 16 to 18, in the EL display panel 2 according to the second embodiment of the present invention, the second power supply line 23B is arranged not to overlap the first semiconductor layer 311 and the second semiconductor layer 321, and includes a first opening 131 formed on the first semiconductor layer 311 and a second opening 132 formed on the second semiconductor layer 321.

In this embodiment, both the first semiconductor layer 311 and the second semiconductor layer 321 are of N-channel type.

The EL display panel 2 according to the second embodiment of the present invention can be manufactured in the same manner as in the first embodiment. However, in this embodiment, it is necessary to form the first opening 131 and the second opening 132 in the second power supply line 23B. The first opening 131 and the second opening 132 can be formed by forming openings in portions where the second power supply line 23B overlaps with the first semiconductor 311 or the second semiconductor layer 321 at the time of patterning the third metal film.

As such, according to the EL display panel 2 of the second embodiment of the present invention, in the same manner as the first embodiment, it is possible to form the gate lines 21 and the first gate electrodes 310G as separate layers. Thus, it is possible to select material suitable for each layer. In addition, the distance between the gate lines 21 and the first power supply lines 23A can be secured. Thus, parasitic capacitance between the gate line 21 and the first power supply line 23A can be reduced.

Furthermore, the first power supply lines 23A and the second power supply lines 23B are arranged crossing each other. Thus, the second source electrode 320S can receive power supply in two directions; from the first power supply line 23A in vertical direction and from the second power supply line 23B in horizontal direction. Therefore, with respect to the IR drop generated along with the increase in screen size of the display apparatus in the central region of the display area, it is possible to reduce the IR drop amount.

Furthermore, the second power supply lines 23B and the auxiliary lines 25 are formed in the same layer as the gate lines 21 and are arranged side-by-side with the gate lines 21, thereby reducing the unevenness on the first interlayer insulating film 340 due to the gate line 21, and improving the flatness of the thin film semiconductor portion.

Furthermore, it is possible to supply power to one pixel by two power supply lines, the first power supply line 23A and the second power supply line 23B. Thus, it is possible to suppress disconnected pixels, thereby suppressing the unevenness in the display of the display apparatus.

Furthermore, the auxiliary lines 25 are arranged in the thin film semiconductor unit instead of the EL unit. Therefore, it is possible to increase the flexibility in design of the EL unit, and to increase the aperture ratio of each pixel.

Furthermore, the EL display panel 2 according to this embodiment achieves the following effects.

When the second power supply line 23B with positive electric potential covers the first interlayer insulating film 340 above the first semiconductor layer 311 and the second semiconductor layer 321 of N-channel type, negative carriers are induced at the back channel of the first semiconductor layer 311 and the second semiconductor layer 321, generating off-leakage current. Therefore, a current is generated without applying the gate voltage. As a result, the OFF characteristics of the first thin film transistor 310 and the second thin film transistor 320 are decreased.

Figure 19:
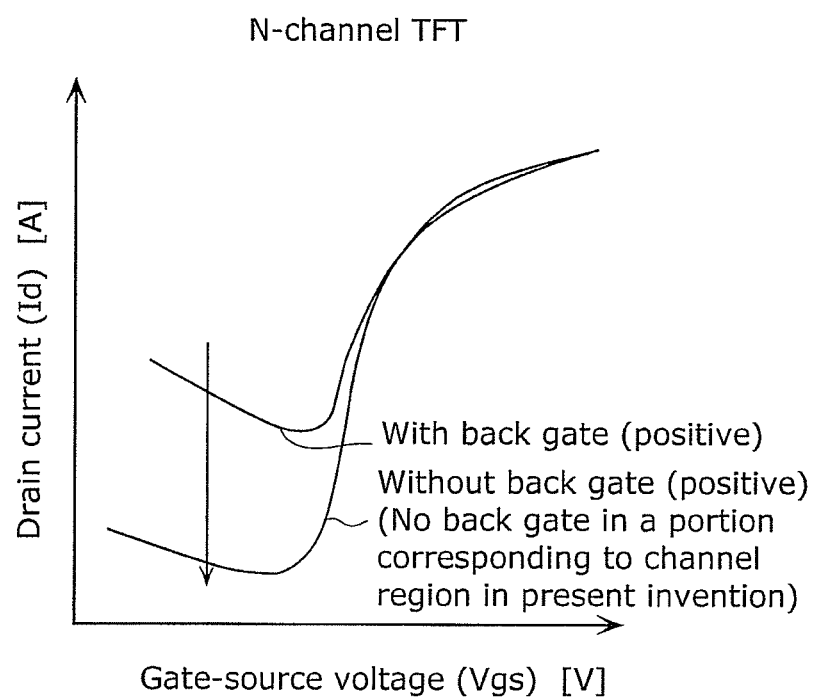
FIG. 19 is a diagram for illustrating the TFT characteristics of the thin film transistor in the EL display panel according to the second embodiment of the present invention.

In contrast, in the EL display panel 2 according to this embodiment, the semiconductor layer 311 and the second semiconductor layer 321 of N-channel type are arranged not to overlap the second power supply line 23B with positive electric potential, composing N-channel TFT without a back gate. As a result, as illustrated in FIG. 19, with regard to the first thin film transistor 310 and the second thin film transistor 320 which are the N-channel TFTs without back gate, the second power supply line 23B suppresses the induced carriers at the back channel, compared to the N-channel TFT with a back gate. As a result, it is possible to reduce the off-leakage current at the first thin film transistor 310 and the second thin film transistor 320. Therefore, it is possible to implement the EL display panel 2 with thin film transistors with good OFF characteristics.

Note that, the effect described above can be achieved as long as at least part of the second power supply line 23B is arranged not to overlap the first semiconductor layer 311 or the second semiconductor layer 321. However, it is preferable to arrange the second power supply line 23B not to overlap with the first semiconductor layer 311 or the second semiconductor layer 321 at all.

Variation of the Second Embodiment

Figure 20:
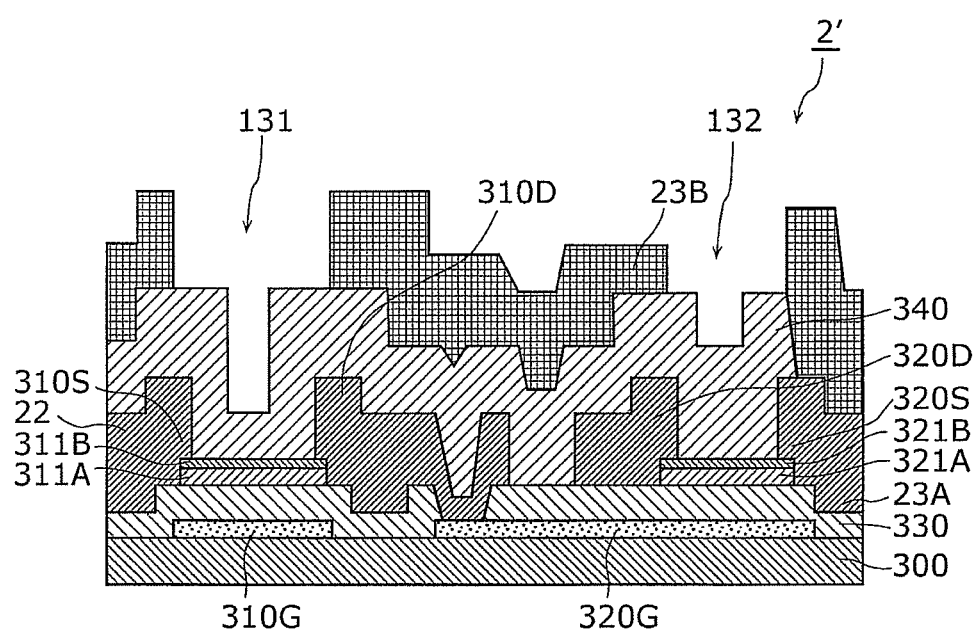
FIG. 20 is a cross-sectional view of the EL display panel according to a variation of the second embodiment of the present invention.

Next, the EL display panel 2' according to a variation of the second embodiment of the present invention shall be described with reference to FIG. 20. FIG. 20 is a cross-sectional view of the EL display panel 2' according to the variation of the second embodiment of the present invention. Note that, FIG. 20 corresponds to FIG. 18, a cross sectional view of the EL display panel 2 according to the second embodiment of the present invention.

The EL display panel 2' according to this variation has the same basic configuration as the EL display panel 2 according to the second embodiment of the present invention. Accordingly, in FIG. 20, the same reference numerals are assigned to the components identical to the components illustrated in FIG. 18, and detailed description for these components are omitted or simplified. Furthermore, the configuration other than the illustration in FIG. 18 is identical to the second embodiment.

The configurations of the first semiconductor layer in the first thin film transistor 310 and the second semiconductor layer in the second thin film transistor 320 in the EL display panel 2' according to this variation are different from the EL display panel 2 according to the second embodiment of the present invention.

As illustrated in FIG. 20, in the EL display panel 2' according to this variation, the first semiconductor layer in the first thin film transistor 310 includes a first channel layer 311A composed of a polycrystalline semiconductor film and a second channel layer 311B composed of a non-crystalline semiconductor film. The second semiconductor layer in the second thin film transistor 320 also includes a first channel layer 321A composed of a polycrystalline semiconductor film and a second channel layer 321B composed of a non-crystalline semiconductor film.

The first channel layer 311A and the first channel layer 321A can be composed of a polycrystalline semiconductor film formed by crystallizing an amorphous silicon film.

The second channel layer 311B and the second channel layer 321B are composed of amorphous silicon film.

The first channel layer 311A and the first channel layer 321A composed of the polycrystalline semiconductor film can be formed by crystallizing the amorphous silicon film through laser irradiation. In planar view, the first channel layer 311A (or the first channel layer 321A) and the second channel layer 311B (or the second channel layer 321B) have the same shape, and are formed in an island-shape on the gate insulating film 330.

The EL display panel 2' according to this variation can achieve the same effects as the EL display panel 2 according to the second embodiment of the present invention.

Furthermore, in the EL display panel 2' according to this variation, the first semiconductor layer and the second semiconductor layer are formed such that the first channel layer 311A composed of the polycrystalline semiconductor film (or the first channel layer 321A) is formed under the second channel layer 311B (or the second channel layer 321B) composed of the amorphous silicon film.

With this, in the first thin film transistor 310 and the second thin film transistor 320, it is possible to increase carrier mobility by the first channel layer 311A and the first channel layer 321A composed of the polycrystalline semiconductor film, thereby improving ON characteristics. In addition, the second channel layer 311B and the second channel layer 321B composed of the amorphous silicon film are formed on the semiconductor layer, thereby maintaining OFF characteristics.

Example 1

Figure 21A:
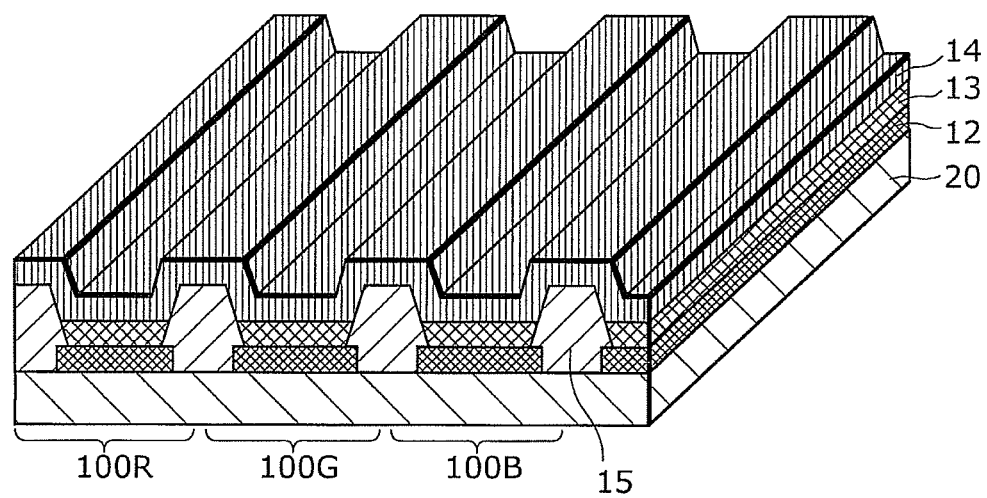
FIG. 21A is a cross-sectional perspective view of the organic EL display panel according to the present invention.
Figure 21B:
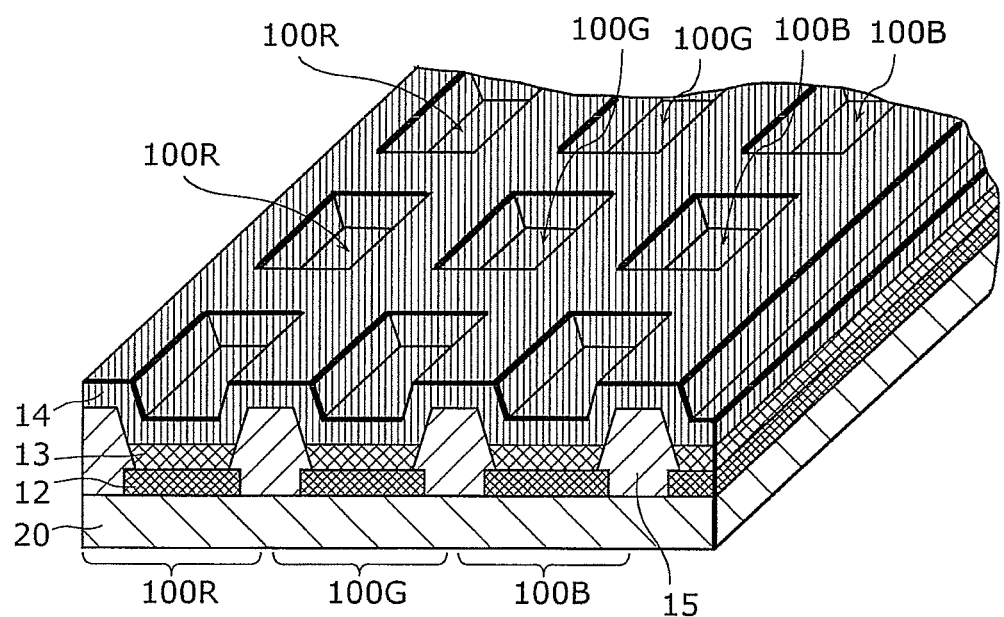
FIG. 21B is a cross-sectional perspective view illustrating another example of the organic EL display panel according to the present invention.

Next, an organic EL display panel as an example of the EL display panel according to the embodiments of the present invention shall be described with reference to FIGS. 21A and 21B. FIG. 21A is a cross-sectional perspective view of an example of the organic EL display panel according to the present invention. FIG. 21B is a cross-sectional perspective view of another example of the organic EL display panel according to the present invention.

As illustrated in FIGS. 21A and 21B, the pixels 100 of the organic EL display panel include sub-pixels 100R, 100G, and 100B in three colors (red, green, and blue). Multiple sub-pixels 100R, 100G, and 100B are arranged in a depth direction of the FIGS. 21A and 21B (referred to as sub-pixel columns).

FIG. 21A illustrates an example of line banks, and the sub-pixel columns are separated by the banks 15. Each of the banks 15 illustrated in FIG. 21A include a protrusion extending between the adjacent sub-pixel columns in a direction in parallel with the source lines 22, and is formed on the thin film semiconductor array device for display apparatus 20. In other words, each of the sub-pixel columns is formed between the adjacent protrusions (that is, an opening of the bank 15).

The lower electrode 12 is formed on the thin film semiconductor array device for display apparatus 20 (more specifically, on the second interlayer insulating film 350), and inside the opening of the bank 15 for each sub-pixels 100R, 100G, and 100B. The organic light emitting layer 13 is formed on the lower electrode 12 and inside the opening of the bank 15 for each sub-pixel column (that is, to cover the lower electrodes 12 in each column). The upper electrode 14 is continuously formed on the organic light-emitting layer 13 and the banks 15 to cover all of the sub-pixels 100R, 100G, and 100B.

FIG. 21B illustrates an example of pixel banks, and each sub-pixel 100R, 100G, or 100B is separated by the banks 15. The banks 15 illustrated in FIG. 21B include protrusions extending in parallel with the gate lines 21 and protrusions extending in parallel with the source lines 22 in parallel crossing each other. The sub-pixels 100R, 100G, and 100B are formed in the portions surrounded by the protrusions (that is, opening of the bank 15).

The lower electrode 12 is formed on the thin film semiconductor array device for display apparatus 20 (more specifically, on the second interlayer insulating film 350), and inside the opening of the bank 15 for each sub-pixel 100R, 100G, or 100B. Similarly, the organic light-emitting layer 13 is formed on the lower electrodes 12 and inside the openings of the bank 15 for each of the sub-pixels 100R, 100G, and 100B. The upper electrode 14 is continuously formed on the organic light-emitting layer 13 and the banks 15 (multiple protrusions) to cover all of the sub-pixels 100R, 100G, and 100B.

Note that, although not shown in FIGS. 21A and 21B, the thin film semiconductor array device for display apparatus 20 includes a pixel circuit 30 for each of the sub-pixels 100R, 100G, and 1008. Furthermore, the sub-pixels 100R, 100G, and 100B are identical except the property of the organic light-emitting layer 13 (color of luminescence).

Example 2

Figure 22:
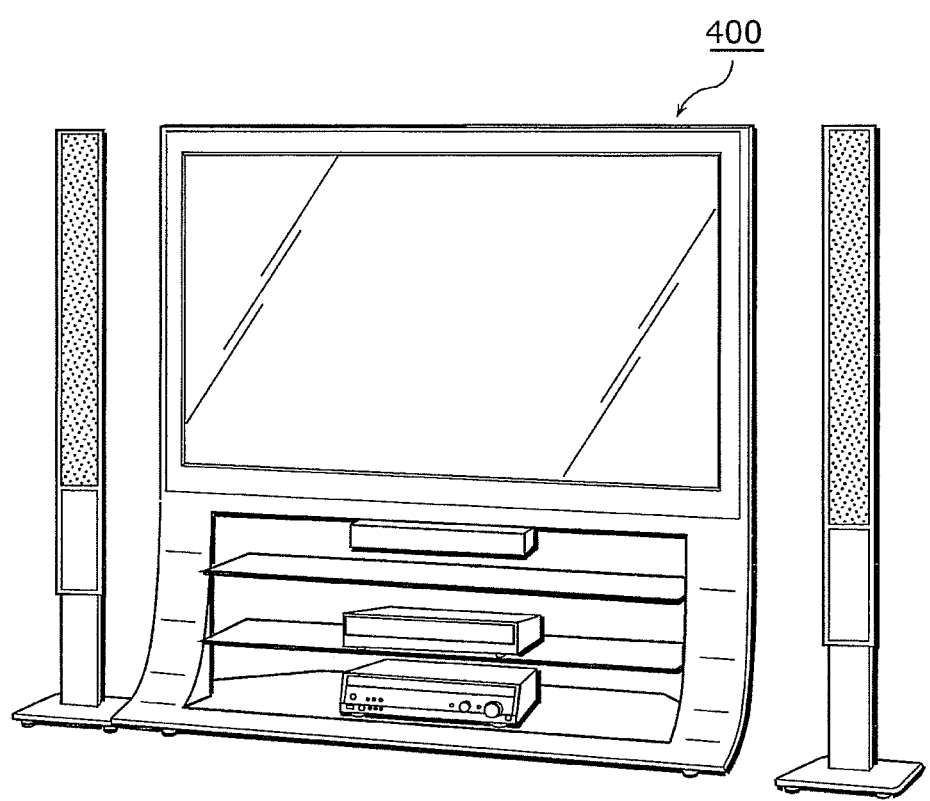
FIG. 22 is an external perspective view illustrating an example of the EL display apparatus according to the present invention.
Figure 23:
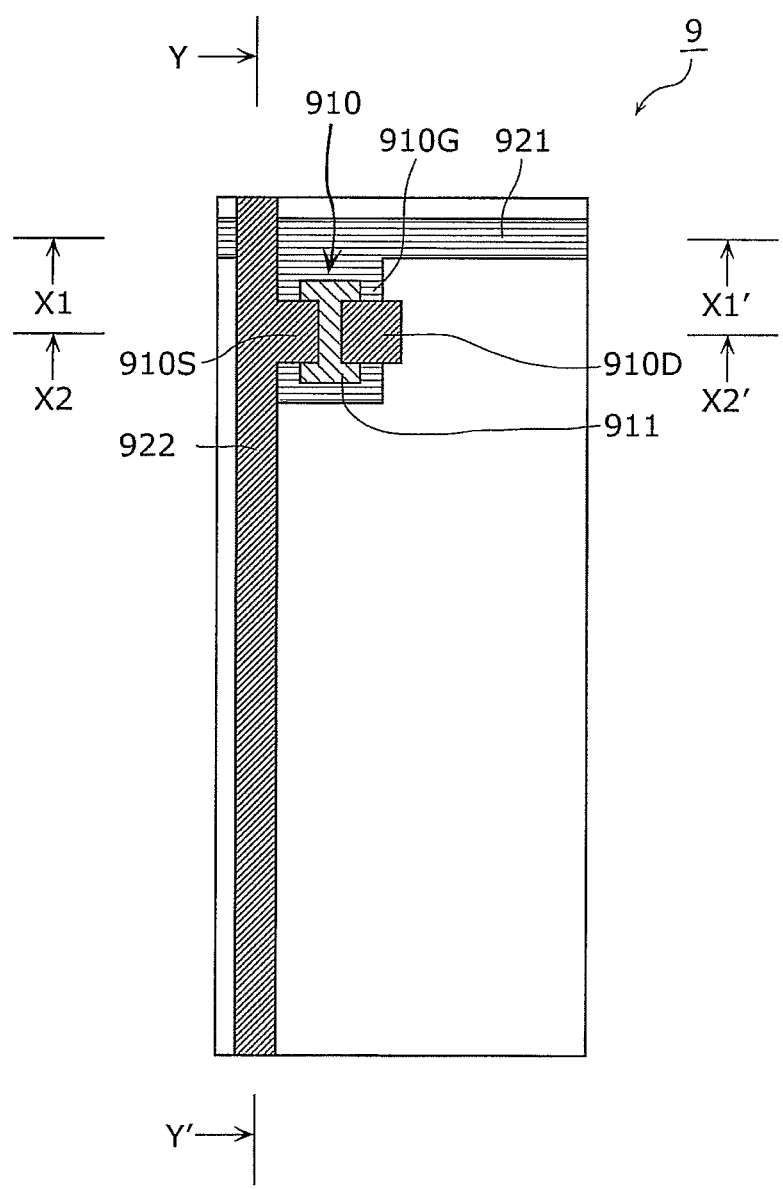
FIG. 23 is a planar view of the conventional thin film semiconductor device for display apparatus in one pixel of the display apparatus.
Figure 24A:
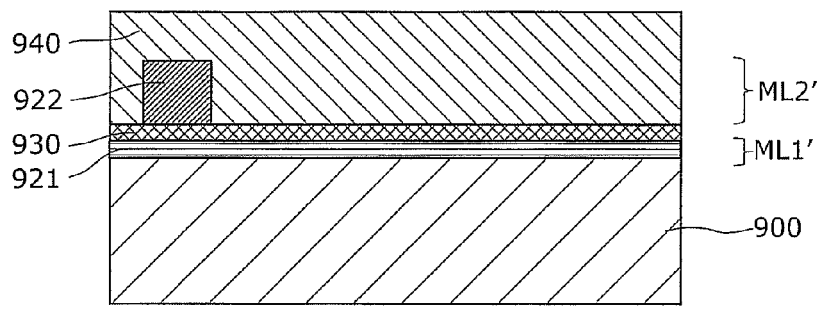
FIG. 24A is a cross-sectional view of the conventional thin film semiconductor device for display apparatus (cross-sectional view along X1-X1' in FIG. 23)
Figure 24B:
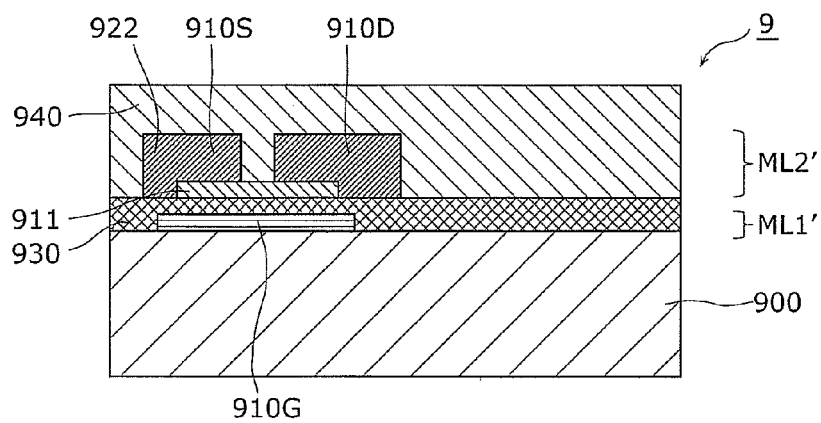
FIG. 24B is a cross-sectional view of the conventional thin film semiconductor device for display apparatus (cross-sectional view along X2-X2' in FIG. 23)
Figure 24C:
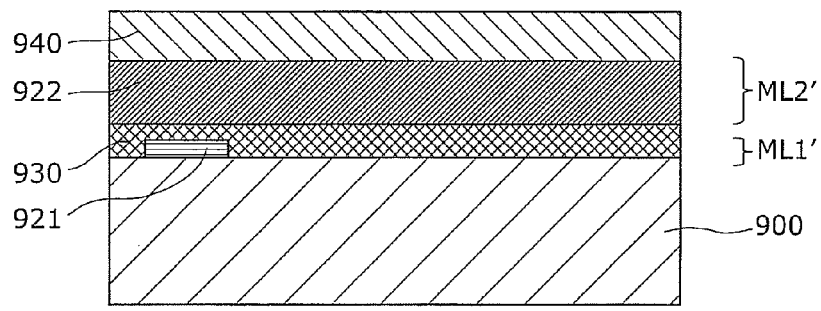
FIG. 24C is a cross-sectional view of the conventional thin film semiconductor device for display apparatus (cross-sectional view along Y-Y' in FIG. 23)
Figure 25:
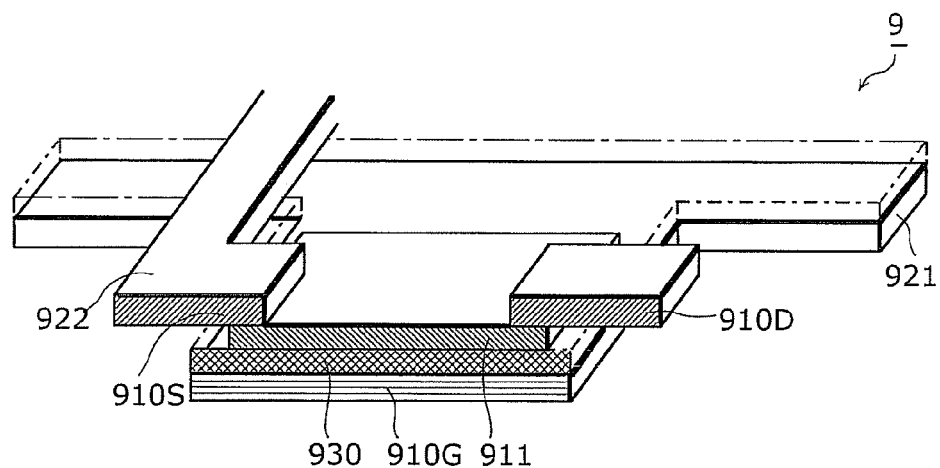
FIG. 25 is a perspective view illustrating major components of the conventional thin film semiconductor device for display apparatus viewed from a cross-sectional surface along X1-X1' in FIG. 23.

Next, an example of the EL display apparatus to which the EL display panel according to the present invention is applied shall be described with reference to FIG. 22. FIG. 22 is an external perspective view illustrating an example of the EL display apparatus according to the present invention.

As illustrated in FIG. 22, the EL display apparatus according to the present invention is a television set 400 in which the EL display panel according to the present invention is embedded.

As such, the EL display panel according to the present invention can be used as a flat panel display, for example. Note that, in addition to television sets, the EL display panel according to the present invention is applicable to any display apparatus such as mobile phones and personal computers.

The EL display panel, the method of manufacturing the EL display panel, and the EL display apparatus according to the present invention have been described based on the embodiments and examples. However, the present invention is not limited to the embodiments and examples.

For example, in this embodiment, the first source electrode 310S and the first drain electrode 310D may be switched. More specifically, the configuration is a configuration in which the first source electrode 310S illustrated in FIGS. 3 and 4 is a first drain electrode, and the first drain electrode 310D illustrated in FIGS. 3 and 4 are the first source electrode. Similarly, the second source electrode 320S and the second drain electrode 320D may be switched. More specifically, the configuration is a configuration in which the second source electrode 320S illustrated in FIGS. 3 and 4 is a second drain electrode, and the second drain electrode 320D illustrated in FIGS. 3 and 4 are the second source electrode.

Furthermore, in the embodiments, the first source electrode 310S is part of the line-shaped source line 22. However, it is not limited to this example. For example, when patterning the source line 22, the extended portion extending from part of the source line 22 in row direction is patterned to electrically connect to the first source electrode 310S separately formed.

Similarly, in this embodiment, the second drain electrode 320D is part of the first power supply line 23A. However, the present invention is not limited to this example. For example, when patterning the first power supply line 23A, the extended portion extending from part of the first power supply line 23A in row direction may be patterned to electrically connect to the second drain electrode 320D separately formed.

Furthermore, in the embodiments, one second power supply line 23B is arranged between the adjacent gate lines 21. However, it is not limited to this example. For example, multiple second power supply lines 23B may be arranged between the adjacent gate lines 21.

Furthermore, in the embodiments, two thin film transistors are formed for one pixel. However, it is not limited to this example. For example, three or more thin film transistors may be formed in one pixel. In this case, more than one second power supply lines 23B may be arranged to match the number of the thin film transistors. With this, it is possible to supply desirable power to the thin film transistors which needs power supply through the second power supply lines 23B.

Furthermore, in this example, the organic EL panel is described as the EL display panel according to the present invention. However, it is not limited to this example. For example, the EL display panel according to the present invention may be an inorganic EL panel.

Those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The EL display panel according to the present invention is widely applicable to display apparatuses such as television set, personal computer, and mobile phone.

What is claimed is:

1. An Electro Luminescence (EL) display panel, comprising:
   an EL unit; and
   a thin film semiconductor configured to control luminescence at said EL unit,
   wherein said EL unit includes:
      an anode electrode, a cathode electrode, and a light-emitting layer interposed between said anode electrode and said cathode electrode,
   said thin film semiconductor includes:
      a substrate;
      a gate electrode above said substrate;
      a gate insulating film above said substrate to cover said gate electrode;
      a semiconductor layer on said gate insulating film and above said gate electrode;
      a first electrode above said semiconductor layer;
      a second electrode in a same layer as said first electrode;

a first power supply line electrically connected to said second electrode and in a same layer as said second electrode;

a first interlayer insulating film above said gate insulating film to cover said first electrode and said second electrode;

a gate line above said first interlayer insulating film to cross said first power supply line, said first interlayer insulating film being in a layer different from said gate electrode;

a second power supply line being in a same layer as said gate line and side-by-side with said gate line; and an auxiliary line in a same layer as said second power supply line and side-by-side with said second power supply line, and said gate electrode and said gate line are electrically connected via a first conductive portion passing through said gate insulating film and said first interlayer insulating film, said first power supply line and said second power supply line are electrically connected via a second conductive portion passing through said first interlayer insulating film, and said auxiliary line is electrically connected to said cathode electrode.

2. The EL display panel according to claim 1,
wherein said second power supply line and said auxiliary line are at a level one of identical to and within a predetermined approximate value from said gate line,
said second power supply line and said auxiliary line are arranged between two adjacent gate lines, and
a width of a combination of said second power supply line and said auxiliary line corresponds to a width of an interval between said two adjacent gate lines.

3. The EL display panel according to claim 2,
wherein a distance from one of said second power supply line and said auxiliary line to said two adjacent gate lines is at least 4 μm.

4. The EL display panel according to claim 1,
wherein said second power supply line and said auxiliary line are at a level one of identical to and within a predetermined approximate value from said gate line, and
said second power supply line and said auxiliary line are arranged near said gate line to fill an interval between two adjacent gate lines.

5. The EL display panel according to claim 1,
wherein said second power supply line and said auxiliary line are at a level one of identical to and within a predetermined approximate value from said gate line, and
said second power supply line and said auxiliary line are wider than a width of said first power supply line.

6. The EL display panel according to claim 2,
wherein said second power supply line and said auxiliary line have a uniform thickness, and are along a shape of a surface under said power supply line and said auxiliary line.

7. The EL display panel according to claim 1,
wherein said semiconductor layer is of N-channel type, and at least a part of said second power supply line is arranged not to overlap said semiconductor layer.

8. The EL display panel according to claim 1,
wherein said semiconductor layer is of P-channel type, and at least a part of said second power supply line is arranged to overlap said semiconductor layer.

9. The EL display panel according to claim 1,
wherein said first electrode is a source electrode, and said second electrode is a drain electrode.

10. The EL display panel according to claim 1,
wherein said first electrode is a drain electrode, and said second electrode is a source electrode.

11. The EL display panel according to claim 1,
wherein a capacitance per unit area of said first interlayer insulating film interposed between a layer of said gate line and a layer of said first power supply line is smaller than a capacitance per unit area of said gate insulating film interposed between a layer of said gate electrode and the layer of said first power supply line.

12. The EL display panel according to claim 1,
wherein a capacitance of said first interlayer insulating film is less than $1.5 \times 10^{-4}$ F/m2, and
a capacitance of said gate insulating film is at least $1.5 \times 10^{-4}$ F/m2.

13. The EL display panel according to claim 1,
wherein said semiconductor layer includes a polycrystalline semiconductor layer.

14. The EL display panel according to claim 1,
wherein material composing said second power supply line and said auxiliary line includes one element selected from among Al, Cu, and Ag.

15. The EL display panel according to claim 14,
wherein said second power supply line and said auxiliary line are multilayered lines, and
main lines composing said second power supply line and said auxiliary line include one element selected from among Al, Cu, and Ag.

16. The EL display panel according to claim 1,
wherein said EL unit is an organic EL unit having an organic light-emitting layer as the said light-emitting layer.

17. An EL display apparatus, comprising:
the EL display panel according to claim 1.

18. A method of manufacturing an Electro Luminescence (EL) display panel, comprising:
preparing a substrate;
forming a gate electrode above the substrate;
forming a gate insulating film above the substrate to cover the gate electrode;
forming a semiconductor layer on the gate insulating film and above the gate electrode;
forming a first electrode above the semiconductor layer and forming, in a same layer as the first electrode, a second electrode and a first power supply line electrically connected to the second electrode;
forming a first interlayer insulating film above the gate insulating film to cover the first electrode and the second electrode;
forming a first contact hole through the gate insulating film and the first interlayer insulating film, and forming a second contact hole through the first interlayer insulating film;
forming, by forming a metal film above the first interlayer insulating film and patterning the metal film, a gate line electrically connected to the gate electrode through the first contact hole and crossing the first power supply line, a second power supply line electrically connected to the first power supply line through the second contact hole and side-by-side with the gate line, and an auxiliary line side-by-side with the second power supply line;
forming a second interlayer insulating film to cover upper surfaces of the first interlayer insulating film, the second power supply line, and the auxiliary line;
forming a third contact hole through the second interlayer insulating film above the auxiliary electrode; and forming, above the second interlayer insulating film, an EL unit including an anode electrode, a cathode electrode, and a light-emitting layer interposed between the anode electrode and the cathode electrode, wherein, in said forming of the EL unit, the cathode electrode and the auxiliary line are electrically connected through the third contact hole.

19. The method of manufacturing the EL display panel according to claim 18, wherein the semiconductor layer is a non-crystalline semiconductor film, and said method further comprises, between said forming of the semiconductor layer and said forming of the first electrode, crystallizing the non-crystalline semiconductor film by irradiating the non-crystalline semiconductor film with a laser to heat the non-crystalline semiconductor film to a predetermined temperature range.

20. The method of manufacturing the EL display panel according to claim 18, wherein the EL unit is an organic EL unit having an organic light-emitting layer as the light-emitting layer.

* * * * *